United States Patent
Park et al.

(10) Patent No.: US 11,496,136 B1
(45) Date of Patent: Nov. 8, 2022

(54) CLOCK GENERATING CIRCUIT AND A SEMICONDUCTOR SYSTEM USING THE CLOCK GENERATING CIRCUIT

(71) Applicant: SK hynix Inc., Icheon-si Gyeonggi-do (KR)

(72) Inventors: Gyu Tae Park, Icheon-si Gyeonggi-do (KR); Young Ouk Kim, Icheon-si Gyeonggi-do (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 17/492,965

(22) Filed: Oct. 4, 2021

(30) Foreign Application Priority Data

Jun. 24, 2021 (KR) .................. 10-2021-0082022

(51) Int. Cl.
| | | |
|---|---|---|
| *H03L 7/081* | (2006.01) | |
| *G06F 1/10* | (2006.01) | |
| *G06F 1/08* | (2006.01) | |
| *G06F 1/06* | (2006.01) | |

(52) U.S. Cl.
CPC .............. *H03L 7/0814* (2013.01); *G06F 1/06* (2013.01); *G06F 1/08* (2013.01); *G06F 1/10* (2013.01); *H03L 7/0816* (2013.01); *H03L 7/0818* (2013.01)

(58) Field of Classification Search
CPC ..... G06F 1/06; G06F 1/10; H03L 7/081–0818
See application file for complete search history.

(56) References Cited

U.S. PATENT DOCUMENTS

| | | | |
|---|---|---|---|
| 7,639,552 B2 * | 12/2009 | Ku ........................... | G11C 7/22 365/194 |
| 7,915,939 B2 | 3/2011 | Jang et al. | |
| 8,237,479 B2 | 8/2012 | Kao et al. | |
| 9,197,202 B2 * | 11/2015 | Jang ...................... | H03K 5/131 |
| 11,349,457 B2 * | 5/2022 | Kim ......................... | H03K 5/01 |

* cited by examiner

*Primary Examiner* — Patrick O Neill
(74) *Attorney, Agent, or Firm* — William Park & Associates Ltd.

(57) ABSTRACT

A clock generating circuit includes a first delay line, a second delay line, a selected phase mixing circuit and, a delay control circuit. The first delay line delays, based on a delay control signal, an input clock signal to generate a first delay clock signal. The second delay line delays, based on the delay control signal, the input clock signal to generate a second delay clock signal. The selected phase mixing circuit generates, based on a first selection signal and a second selection signal, an output clock signal from at least one between the first delay clock signal and the second delay clock signal. The delay control circuit monitors duty cycles of the first delay clock signal and the second delay clock signal to generate the first selection signal and the second selection signal thereby selecting at least one between the first delay line and the second delay line.

21 Claims, 6 Drawing Sheets

CLOCK GENERATING CIRCUIT AND A SEMICONDUCTOR SYSTEM USING THE CLOCK GENERATING CIRCUIT

CROSS-REFERENCES TO RELATED APPLICATION

The present application claims priority under 35 U.S.C. § 119(a) to Korean application number 10-2021-0082022, filed on Jun. 24, 2021, in the Korean Intellectual Property Office, which is incorporated herein by reference in its entirety as set forth in full.

BACKGROUND

1. Technical Field

Various embodiments generally relate to an integrated circuit technology, and, more particularly, to a clock generating circuit and a semiconductor system using the clock generating circuit.

2. Related Art

An electronic device includes a lot of electronic elements, and a computer system may include a lot of semiconductor apparatuses each included with a semiconductor. Semiconductor apparatuses including a computer system may communicate with one another by transmitting and receiving a clock signal and data. In synchronization with a clock signal, the semiconductor apparatuses may transmit or receive data. The semiconductor apparatuses may transmit and/or receive a system clock signal to and/or from an external apparatus (i.e., another semiconductor apparatus). In synchronization with the system clock signal, the semiconductor apparatuses may transmit and receive data. Each of the semiconductor apparatuses may include a clock buffer and/or a receiver to receive the system clock signal and may provide the received system clock signal to an internal circuit related to a data input/output operation and an internal circuit configured to operate in synchronization with a clock signal. Due to an internal delay time within each of the semiconductor apparatuses, there may occur phase difference between the system clock signal and clock signals provided to the internal circuits. Therefore, in order to compensate for such phase difference, each of the semiconductor apparatuses is provided with a clock generating circuit. The clock generating circuit may be provided with a variable delay line, which can be controlled in a digital and/or analogue way, to generate an internal clock signal from the system clock signal. As the fabrication of a semiconductor apparatus becomes more micro, local variation between semiconductor devices becomes greater. The local variation may cause change in a delay amount of the variable delay line and change in phase and duty of an internal clock signal generated by the clock generating circuit.

SUMMARY

According to an embodiment, a clock generating circuit may include a first delay line, a second delay line, a selected phase mixing circuit, and a delay control circuit. The first delay line may be configured to delay, based on a delay control signal, an input clock signal to generate a first delay clock signal. The second delay line may be configured to delay, based on the delay control signal, the input clock signal to generate a second delay clock signal. The selected phase mixing circuit may be configured to generate, based on a first selection signal and a second selection signal, an output clock signal from at least one between the first delay clock signal and the second delay clock signal. The delay control circuit may be configured to monitor respective duty cycles of the first delay clock signal and the second delay clock signal to generate the first selection signal and the second selection signal and configured to generate the delay control signal based on a result of the monitoring of the duty cycles.

According to an embodiment, a clock generating circuit may include a first delay line, a second delay line, a third delay line, a fourth delay line, a selected phase mixing circuit, and a delay control circuit. The first delay line may be configured to delay, based on a delay control signal, an input clock signal to generate a first delay clock signal. The second delay line may be configured to delay, based on the delay control signal, the input clock signal to generate a second delay clock signal having a phase difference corresponding to a unit amount of time from the first delay clock signal. The third delay line may be configured to delay, based on the delay control signal, the input clock signal to generate a third delay clock signal. The fourth delay line may be configured to delay, based on the delay control signal, the input clock signal to generate a fourth delay clock signal having a phase difference corresponding to the unit amount of time from the third delay clock signal. The selected phase mixing circuit may be configured to generate, based on a first selection signal and a third selection signal, a first phase clock signal from at least one between the first delay clock signal and the third delay clock signal and configured to generate, based on a second selection signal and a fourth selection signal, a second phase clock signal from at least one between the second delay clock signal and the fourth delay clock signal. The delay control circuit may be configured to monitor respective duty cycles of the first to fourth delay clock signals to generate the first to fourth selection signals and configured to generate the delay control signal based on a result of the monitoring of the duty cycles.

According to an embodiment, a semiconductor system may include a semiconductor apparatus and an external apparatus. The semiconductor apparatus may be configured to generate a plurality of internal clock signals based on a system clock signal and configured to output data based on the plurality of internal clock signals. The external apparatus may be configured to provide the system clock signal and configured to monitor the data output from the semiconductor apparatus to generate a command address signal. The semiconductor apparatus may include an internal clock generating circuit, a data output circuit, and a command decoder. The internal clock generating circuit may be configured to receive the system clock signal, delay the system clock signal to generate a first delay clock signal and a second delay clock signal, and generate, based on a first selection signal and a second selection signal, the plurality of internal clock signals from at least one between the first delay clock signal and the second delay clock signal. The data output circuit may be configured to output, in synchronization with the plurality of internal clock signals, internal data as the data. The command decoder may be configured to generate the first selection signal and the second selection signal based on the command address signal.

DETAILED DESCRIPTION

Figure 1:
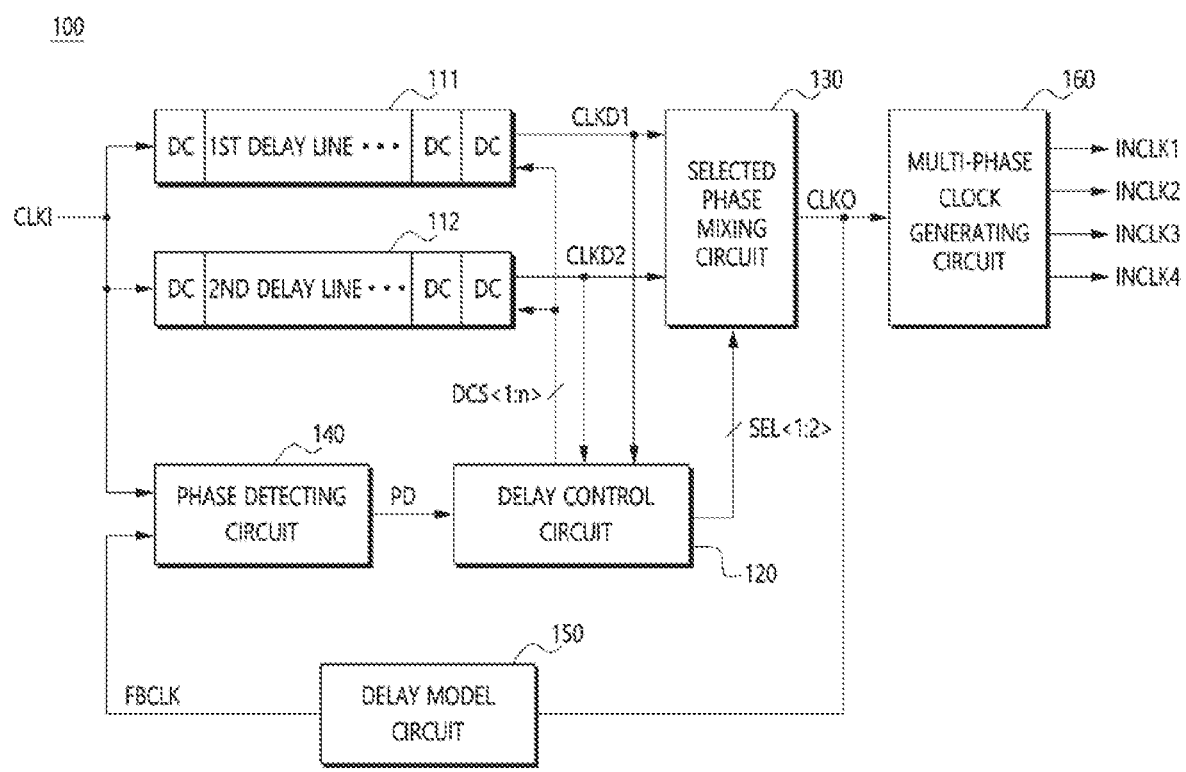
FIG. 1 is a diagram illustrating a configuration of a clock generating circuit according to an embodiment.

FIG. 1 is a diagram illustrating a configuration of a clock generating circuit 100 according to an embodiment. Referring to FIG. 1, the clock generating circuit 100 may receive an input clock signal CLKI to generate an output clock signal CLKO. The clock generating circuit 100 may variably delay the input clock signal CLKI to generate the output clock signal CLKO. The clock generating circuit 100 may perform a delay locked loop operation on the input clock signal CLKI to generate the output clock signal CLKO. The clock generating circuit 100 may include at least two number of delay lines configured to variably delay the input clock signal CLKI. The two delay lines may have the same structure to perform the same operation. However, characteristics of the two delay lines may become different from each other due to the local variation. The clock generating circuit 100 may monitor the characteristics of the two delay lines and may selectively utilize one having better characteristic between the two delay lines.

The clock generating circuit 100 may include a first delay line 111, a second delay line 112, a delay control circuit 120 and a selected phase mixing circuit 130. The first delay line 111 may receive the input clock signal CLKI and a delay control signal DCS<1:n> ('n' is an integer of 2 or greater) to generate a first delay clock signal CLKD1. The first delay line 111 may delay, based on the delay control signal DCS<1:n>, the input clock signal CLKI to generate the first delay clock signal CLKD1. The first delay line 111 may variably delay the input clock signal CLKI based on the delay control signal DCS<1:n> and a delay amount of the first delay line 111 may depend on the delay control signal DCS<1:n>. The second delay line 112 may receive the input clock signal CLKI and the delay control signal DCS<1:n> to generate a second delay clock signal CLKD2. The second delay line 112 may delay, based on the delay control signal DCS<1:n>, the input clock signal CLKI to generate the second delay clock signal CLKD2. The second delay line 112 may variably delay the input clock signal CLKI based on the delay control signal DCS<1:n> and a delay amount of the second delay line 112 may depend on the delay control signal DCS<1:n>. The first delay line 111 may have the same structure as the second delay line 112. Ideally, the delay amounts of the first delay line 111 and the second delay line 112, which depend on the delay control signal DCS<1:n>, may be the same as each other and duty cycles of the first delay clock signal CLKD1 and the second delay clock signal CLKD2 may be the same as each other. However, in actual fact, due to the local variation in the fabrication process, the delay amounts of the first delay line 111 and the second delay line 112 may become different from each other and the duty cycles of the first delay clock signal CLKD1 and the second delay clock signal CLKD2 may become different from each other.

Each of the first delay line 111 and the second delay line 112 may include a plurality of delay cells DC. Each of the plurality of delay cells DC may have a delay amount corresponding to a unit amount of time. The plurality of delay cells DC may be serially coupled to each other to sequentially delay the input clock signal CLKI. As more delay cells are enabled among the plurality of delay cells DC, the input clock signal CLKI may be delayed by a greater delay amount. The delay control signal DCS<1:n> may be a digital code signal having plural bits. A number of bits included in the delay control signal DCS<1:n> may correspond to a number of delay cells included in each of the first delay line 111 and the second delay line 112. The plurality of delay cells DC within each of the first delay line 111 and the second delay line 112 may respectively receive the plural bits of the delay control signal DCS<1:n>. It is assumed that the number of bits within the delay control signal DCS<1:n> is eight (8) and the number of the delay cells within each of the first delay line 111 and the second delay line 112 is also eight (8). When the delay control signal DCS<1:n> has bit values of '0,0,0,0,0,1,1', three (3) number of delay cells may be enabled among the plurality of delay cells DC within each of the first delay line 111 and the second delay line 112 and the delay amount of each of the first delay line 111 and the second delay line 112 may be three (3) times greater than the unit amount of time.

The delay control circuit 120 may receive the first delay clock signal CLKD1 and the second delay clock signal CLKD2. The delay control circuit 120 may monitor the duty cycle of each of the first delay clock signal CLKD1 and the second delay clock signal CLKD2. The delay control circuit 120 may monitor the duty cycle of each of the first delay clock signal CLKD1 and the second delay clock signal CLKD2 to generate a first selection signal SEL<1> and a second selection signal SEL<2>, respectively. It may be a monitoring mode, in which the delay control circuit 120 may monitor the duty cycle of each of the first delay clock signal CLKD1 and the second delay clock signal CLKD2. In the monitoring mode, the clock generating circuit 100 may determine the characteristics of the first delay line 111 and the second delay line 112 by monitoring the duty cycle of each of the first delay clock signal CLKD1 and the second delay clock signal CLKD2 that are respectively output from the first delay line 111 and the second delay line 112, and, according to a result of the determination, may select at least one between the first delay line 111 and the second delay line 112. The delay control circuit 120 may generate the delay control signal DCS<1:n> based on a result of the monitoring of the duty cycle. The delay control circuit 120 may change a value of the delay control signal DCS<1:n> whenever generating the result of the monitoring of the duty cycle of each of the first delay clock signal CLKD1 and the second delay clock signal CLKD2. In an embodiment, in the monitoring mode, the delay control circuit 120 may initially set the delay control signal DCS<1:n> to have a minimum value and may increase the value of the delay control signal DCS<1:n> from the minimum value based on the result of the monitoring. In an embodiment, in the monitoring mode, the delay control circuit 120 may initially set the delay control signal DCS<1:n> to have a maximum value and may decrease the value of the delay control signal DCS<1:n> from the maximum value based on the result of the monitoring. In an embodiment, in the monitoring mode, the delay control circuit 120 may initially set the delay control signal DCS<1:n> to have a value other than the minimum value and the maximum value. The delay control circuit 120 may detect the characteristics of the respective delay cells DC within each of the first delay line 111 and the second delay line 112 by gradually increasing or decreasing the value of the delay control signal DCS<1:n>. For example, as the delay control circuit 120 gradually increases the value of the delay control signal DCS<1:n> from the minimum value, the number of the enabled delay cells may gradually increase among the plurality of delay cells DC. As the number of the enabled delay cells gradually increases, the delay control circuit 120 may detect the characteristics of the respective delay cells DC by monitoring the duty cycles of the first delay clock signal CLKD1 and the second delay clock signal CLKD2.

The delay control circuit 120 may detect the duty cycle of the first delay clock signal CLKD1 to determine the characteristic of the first delay line 111. The delay control circuit 120 may determine the characteristic of the first delay line 111 according to an amount of change in the duty cycle of the first delay clock signal CLKD1. The delay control circuit 120 may selectively enable the first selection signal SEL<1> according to the determined characteristic of the first delay line 111. For example, the delay control circuit 120 may disable the first selection signal SEL<1> when the amount of change is great in the duty cycle of the first delay clock signal CLKD1, and may enable the first selection signal SEL<1> when the amount of change is small in the duty cycle of the first delay clock signal CLKD1, The delay control circuit 120 may detect the duty cycle of the first delay clock signal CLKD1 to determine whether the duty cycle of the first delay clock signal CLKD1 changes within a reference range. The delay control circuit 120 may enable the first selection signal SEL<1> when the duty cycle of the first delay clock signal CLKD1 changes within the reference range. The delay control circuit 120 may disable the first selection signal SEL<1> when the duty cycle of the first delay clock signal CLKD1 changes beyond the reference range. The reference range may be a value that is arbitrarily set.

The delay control circuit 120 may detect the duty cycle of the second delay clock signal CLKD2 to determine the characteristic of the second delay line 112. The delay control circuit 120 may determine the characteristic of the second delay line 112 according to an amount of change in the duty cycle of the second delay clock signal CLKD2. The delay control circuit 120 may selectively enable the second selection signal SEL<2> according to the determined characteristic of the second delay line 112. For example, the delay control circuit 120 may disable the second selection signal SEL<2> when the amount of change is great in the duty cycle of the second delay clock signal CLKD2, and may enable the second selection signal SEL<2> when the amount of change is small in the duty cycle of the second delay clock signal CLKD2. The it delay control circuit 120 may detect the duty cycle of the second delay clock signal CLKD2 to determine whether the duty cycle of the second delay clock signal CLKD2 changes within the reference range. The delay control circuit 120 may enable the second selection signal SEL<2> when the duty cycle of the second delay clock signal CLKD2 changes within the reference range. The delay control circuit 120 may disable the second selection signal SEL<2> when the duty cycle of the second delay clock signal CLKD2 changes beyond the reference range.

When both the duty cycles of the first delay clock signal CLKD1 and the second delay clock signal CLKD2 change within the reference range, the delay control circuit 120 may enable at least one between the first selection signal SEL<1> and the second selection signal SEL<2>. For example, the delay control circuit 120 may enable the first selection signal SEL<1> while disabling the second selection signal SEL<2>. When both the duty cycles of the first delay clock signal CLKD1 and the second delay clock signal CLKD2 change beyond the reference range, the delay control circuit 120 may enable both the first selection signal SEL<1> and the second selection signal SEL<2>.

The selected phase mixing circuit 130 may receive the first delay clock signal CLKD1 and the second delay clock signal CLKD2 respectively from the first delay line 111 and the second delay line 112. The selected phase mixing circuit 130 may receive the first selection signal SEL<1> and the second selection signal SEL<2> from the delay control circuit 120. The selected phase mixing circuit 130 may generate, based on the first selection signal SEL<1> and the second selection signal SEL<2>, the output clock signal CLKO from at least one between the first delay clock signal CLKD1 and the second delay clock signal CLKD2. The selected phase mixing circuit 130 may select at least one between the first delay clock signal CLKD1 and the second delay clock signal CLKD2 based on the first selection signal SEL<1> and the second selection signal SEL<2>, The selected phase mixing circuit 130 may generate the output clock signal CLKO from the selected delay clock signal between the first delay clock signal CLKD1 and the second delay clock signal CLKD2 or may generate the output clock signal CLKO by mixing phases of the first delay clock signal CLKD1 and the second delay clock signal CLKD2. When the first selection signal SEL<1> is enabled, the selected phase mixing circuit 130 may drive the first delay clock signal CLKD1 and generate the driven first delay clock signal as the output clock signal CLKO. When the second selection signal SEL<2> is enabled, the selected phase mixing circuit 130 may drive the second delay clock signal CLKD2 and generate the driven second delay clock signal as the output clock signal CLKO. When both the first selection signal SEL<1> and the second selection signal SEL<2> are enabled, the selected phase mixing circuit 130 may mix the phases of the first delay clock signal CLKD1 and the second delay clock signal CLKD2 and generate the phase mixed clock signal as the output clock signal CLKO. The output clock signal has a phase between the first delay clock signals CLKD1 and the second delay clock signal CLKD2.

The clock generating circuit 100 may further include a phase detecting circuit 140. The phase detecting circuit 140 may be operable when the clock generating circuit 100 operates in a normal mode. In the normal mode, the clock generating circuit 100 may perform the delay locked loop operation on the input clock signal CLKI. The clock generating circuit 100 may enter the normal mode after the characteristics of the first delay line 111 and the second delay line 112 are determined in the monitoring mode. In an embodiment, the clock generating circuit 100 may enter the normal mode before entering the monitoring mode or may enter both the normal mode and the monitoring mode at the same time. In the normal mode, the clock generating circuit 100 may perform the delay locked loop operation on the input clock signal CLKI to variably delay the input clock signal CLKI thereby generating the output clock signal CLKO. The phase detecting circuit 140 may receive the input clock signal CLKI and a feedback clock signal FBCLK, which is generated by delaying the output clock signal CLKO by an amount of modelled delay time. The clock generating circuit 100 may further include a delay model circuit 150. The delay model circuit 150 may be a delay circuit having a delay amount corresponding to the modelled delay time. The modelled delay time may be arbitrarily set. The delay model circuit 150 may delay the output clock signal CLKO by the amount of the modelled delay time to generate the feedback clock signal FBCLK. The phase detecting circuit 140 may detect the phases of the feedback clock signal FBCLK and the input clock signal CLKI to generate a phase detection signal PD. The phase detecting circuit 140 may compare the phases of the input clock signal CLKI and the feedback clock signal FBCLK with each other to generate the phase detection signal PD having different logic levels. For example, the phase detecting circuit 140 may generate the phase detection signal PD having a logic high level when the phase of the input clock signal CLKI leads the phase of the feedback clock signal FBCLK. Also, the phase detecting circuit 140 may generate the phase detection signal PD having a logic low level when the phase of the input clock signal CLKI lags behind the phase of the feedback clock signal FBCLK.

The delay control circuit 120 may further receive the phase detection signal PD from the phase detecting circuit 140. The delay control circuit 120 may change the delay control signal DCS<1:n> based on the phase detection signal PD. For example, the delay control circuit 120 may increase the value of the delay control signal DCS<1:n> when the phase detection signal PD has a logic high level. Also, the delay control circuit 120 may decrease the value of the delay control signal DCS<1:n> when the phase detection signal PD has a logic low level. In an embodiment, the phase detecting circuit 140 may quantize the phase difference between the input clock signal CLKI and the feedback clock signal FBCLK to generate the phase detection signal PD and the delay control circuit 120 may variously change, based on the phase detection signal PD, the value of the delay control signal DCS<1:n> as much as intended. In an embodiment, the delay control circuit 120 may be provided with an average filter or a moving average filter and may change the value of the delay control signal DCS<1:n> only when the phase detection signal PD having the same logic level is continuously generated.

Figure 2:
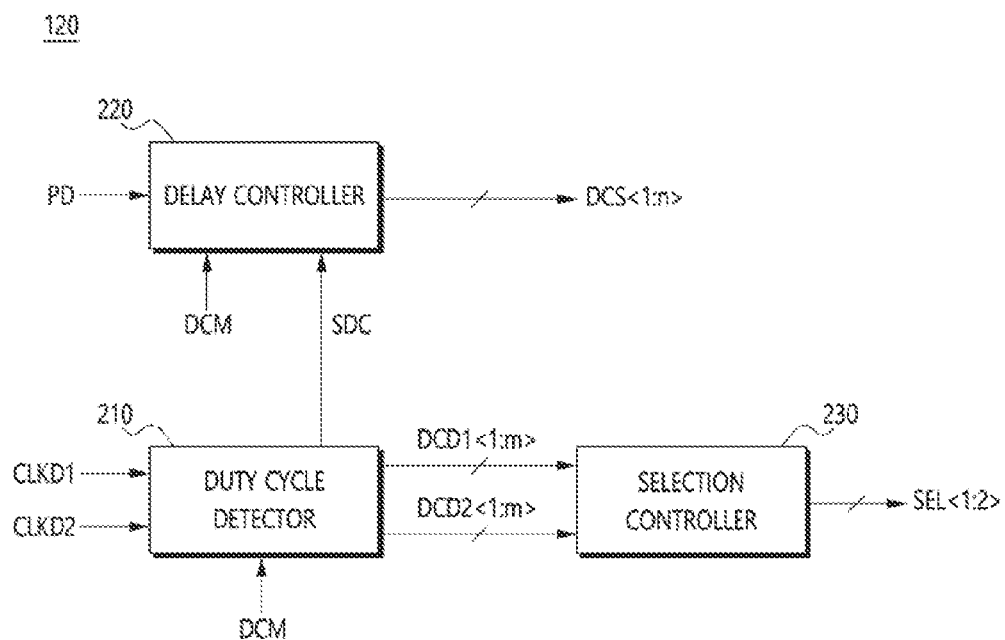
FIG. 2 is a diagram illustrating a configuration of a delay control circuit illustrated in FIG. 1.

The clock generating circuit 100 may further include a multi-phase clock generating circuit 160. The multi-phase clock generating circuit 160 may receive the output clock signal CLKO to generate a plurality of internal clock signals. The multi-phase clock generating circuit 160 may generate the plurality of internal clock signals with or without division of the frequency of the output clock signal CLKO. The plurality of internal clock signals may have different phases from one another but the phases thereof may be synchronized with the edge of the output clock signal CLKO. For example, the multi-phase clock generating circuit 160 may generate first to fourth internal clock signals INCLK1, INCLK2, INCLK3 and INCLK4 from the output clock signal CLKO. The first to fourth internal clock signals INCLK1, INCLK2, INCLK3 and INCLK4 may sequentially have a phase difference corresponding to 90°. The first internal clock signal INCLK1 may have a phase leading the second internal clock signal INCLK2 by an amount of 90°, the second internal clock signal INCLK2 may have a phase leading the third internal clock signal INCLK3 by an amount of 90°, the third internal clock signal INCLK3 may have a phase leading the fourth internal clock signal INCLK4 by an amount of 90° and the fourth internal clock signal INCLK4 may have a phase leading the first internal clock signal INCLK1 by an amount of 90°, FIG. 2 is a diagram illustrating a configuration of the delay control circuit 120 illustrated in FIG. 1. Referring to FIG. 2, the delay control circuit 120 may include a duty cycle detector 210, a delay controller 220 and a selection controller 230. The duty cycle detector 210 may receive the first delay clock signal CLKD1 and the second delay clock signal CLKD2. The duty cycle detector 210 may generate a first duty detection signal DCD1<1:m> ('m' is an integer of 2 or greater) and a second duty detection signal DCD2<1:m> based on the first delay clock signal CLKD1 and the second delay clock signal CLKD2. The duty cycle detector 210 may detect the duty cycle of the first delay clock signal CLKD1 to generate the first duty detection signal DCD1<1:m> and may detect the duty cycle of the second delay clock signal CLKD2 to generate the second duty detection signal DCD2<1:m>. Each of the first duty detection signal DCD1<1:m> and the second duty detection signal DCD2<1:m> may be a digital code signal having plural bits. The first duty detection signal DCD1<1:m> and the second duty detection signal DCD2<1:m> may have logic values changing according to the duty cycles of the first delay clock signal CLKD1 and the second delay clock signal CLKD2, respectively. For example, the duty cycle detector 210 may generate the first duty detection signal DCD1<1:m> and the second duty detection signal DCD2<1:m> having an intermediate value when the first delay clock signal CLKD1 and the second delay clock signal CLKD2 have a 50:50 ratio of a high level section and a low level section, respectively. Also, the duty cycle detector 210 may generate the first duty detection signal DCD1<1:m> and the second duty detection signal DCD2<1:m> having greater values as high level sections of the first delay clock signal CLKD1 and the second delay clock signal CLKD2 increase, respectively. Further, the duty cycle detector 210 may generate the first duty detection signal DCD1<1:m> and the second duty detection signal DCD2<1:m> having smaller values as low level sections of the first delay clock signal CLKD1 and the second delay clock signal CLKD2 increase, respectively. The duty cycle detector 210 may generate a step control signal SDC whenever detecting the duty cycles of the first delay clock signal CLKD1 and the second delay clock signal CLKD2. The duty cycle detector 210 may generate the step control signal SDC whenever generating the first duty detection signal DCD1<1:m> and the second duty detection signal DCD2<1:m>. The step control signal SDC may be provided to the delay controller 220. The duty cycle detector 210 may further receive an operation mode signal DCM. The operation mode signal DCM may be a signal discriminating between the monitoring mode and the normal mode. When the operation mode signal DCM is enabled, the clock generating circuit 100 may operate in the monitoring mode. When the operation mode signal DCM is disabled, the clock generating circuit 100 may operate in the normal mode. When the operation mode signal DCM is enabled, the duty cycle detector 210 may be activated to detect the duty cycles of the first delay clock signal CLKD1 and the second delay clock signal CLKD2 thereby generating the step control signal SDC. When the operation mode signal DCM is disabled, the duty cycle detector 210 may be deactivated not to detect the duty cycles of the first delay clock signal CLKD1 and the second delay clock signal CLKD2 thereby not generating the step control signal SDC.

The delay controller 220 may receive the phase detection signal PD. The delay controller 220 may generate the delay control signal DCS<1:n> based on the phase detection signal PD. The delay controller 220 may increase or decrease the value of the delay control signal DCS<1:n> according to the logic level of the phase detection signal PD. The delay controller 220 may receive the step control signal SDC from the duty cycle detector 210. The delay controller 220 may change the value of the delay control signal DCS<1:n> based on the step control signal SDC. The delay controller 220 may gradually increase or decrease the value of the delay control signal DCS<1:n> whenever receiving the step control signal SDC. The delay controller 220 may further receive the operation mode signal DCM. When the operation mode signal DCM is enabled, the delay controller 220 may initialize the delay control signal DCS<1:n> and may gradually change the value of the delay control signal DCS<1:n> based on the step control signal SDC, When the operation mode signal DCM is disabled, the delay controller 220 may change the value of the delay control signal DCS<1:n> based on the phase detection signal PD.

The selection controller 230 may receive the first duty detection signal DCD1<1:m> and the second duty detection signal DCD2<1:m> from the duty cycle detector 210. The selection controller 230 may accumulate and store the first duty detection signal DCD1<1:m> and the second duty detection signal DCD2<1:m>. The selection controller 230 may selectively enable the first selection signal SEL<1> and the second selection signal SEL<2> based on the first duty detection signal DCD1<1:m> and the second duty detection signal DCD2<1:m>, which are accumulated and stored. When the first duty detection signal DCD1<1:m> changes within the reference range, the selection controller 230 may determine the first delay line 111 to have a good characteristic and may enable the first selection signal SEL<1>. When the first duty detection signal DCD1<1:m> changes beyond the reference range, the selection controller 230 may determine the first delay line 111 to have a bad characteristic and may disable the first selection signal SEL<1>. When the second duty detection signal DCD2<1:m> changes within the reference range, the selection controller 230 may determine the second delay line 112 to have a good characteristic and may enable the second selection signal SEL<2>. When the second duty detection signal DCD2<1:m> changes beyond the reference range, the selection controller 230 may determine the second delay line 112 to have a bad characteristic and may disable the second selection signal SEL<2>.

The selection controller 230 may operate as shown in Table 1.

TABLE 1

| CLKD1 | CLKD2 | SEL<1> | SEL<2> |
|---|---|---|---|
| Good | Good | Enable | Disable |
| Good | Bad | Enable | Disable |
| Bad | Good | Disable | Enable |
| Bad | Bad | Enable | Enable |

Referring to Table 1, when both the duty cycles of the first delay clock signal CLKD1 and the second delay clock signal CLKD2 change within the reference range, the selection controller 230 may determine both the first delay line 111 and the second delay line 112 to have good characteristics and may enable one between the first selection signal SEL<1> and the second selection signal SEL<2>. For example, the selection controller 230 may enable the first selection signal SEL<1> while disabling the second selection signal SEL<2>. When the duty cycle of the first delay clock signal CLKD1 changes within the reference range but the duty cycle of the second delay clock signal CLKD2 changes beyond the reference range, the selection controller 230 may determine the first delay line 111 to have a good characteristic but may determine the second delay line 112 to have a bad characteristic. Therefore, the selection controller 230 may enable the first selection signal SEL<1> while disabling the second selection signal SEL<2>. When the duty cycle of the second delay clock signal CLKD2 changes within the reference range but the duty cycle of the first delay clock signal CLKD1 changes beyond the reference range, the selection controller 230 may determine the second delay line 112 to have a good characteristic but may determine the first delay line 111 to have a bad characteristic. Therefore, the selection controller 230 may enable the second selection signal SEL<2> while disabling the first selection signal SEL<1>. When both the duty cycles of the first delay clock signal CLKD1 and the second delay clock signal CLKD2 change beyond the reference range, the selection controller 230 may determine both the first delay line 111 and the second delay line 112 to have bad characteristics and may enable both the first selection signal SEL<1> and the second selection signal SEL<2>. After monitoring the characteristics of the first delay line 111 and the second delay line 112, the selection controller 230 may fix the states of the first selection signal SEL<1> and the second selection signal SEL<2>. In an embodiment, the selection controller 230 may include a register or a one-time programmable memory for fixing the states of the first selection signal SEL<1> and the second selection signal SEL<2>.

Figure 3:
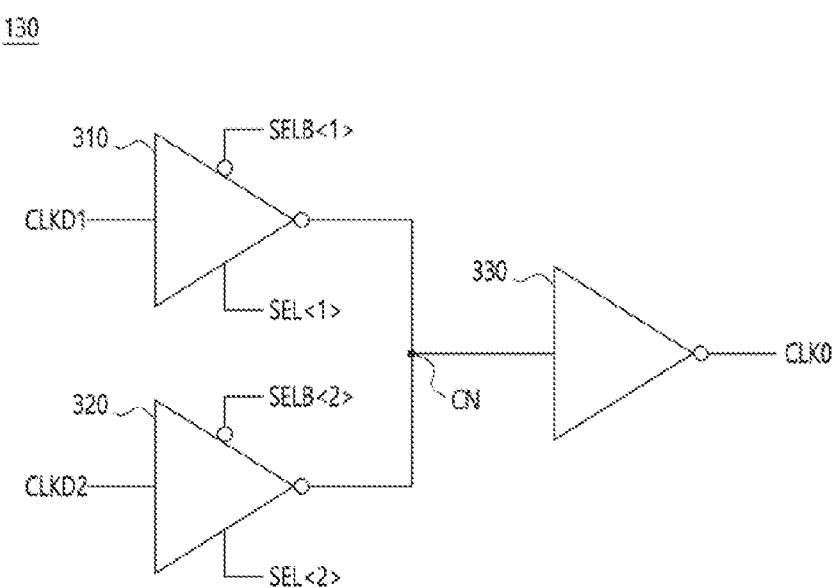
FIG. 3 is a diagram illustrating a configuration of a selected phase mixing circuit illustrated in FIG. 1.

FIG. 3 is a diagram illustrating a configuration of the selected phase mixing circuit 130 illustrated in FIG. 1. Referring to FIG. 3, the selected phase mixing circuit 130 may include a first driver 310, a second driver 320 and a third driver 330. The first driver 310 may receive the first delay clock signal CLKD1 and the first selection signal SEL<1>. When the first selection signal SEL<1> is enabled, the first driver 310 may drive the first delay clock signal CLKD1 and may output the driven first delay clock signal CLKD1 to a common node CN. The first driver 310 may be an inverter. When the first selection signal SEL<1> has a logic high level and a complementary signal SELB<1> of the first selection signal SEL<1> has a logic low level, the first driver 310 may inversion-drive the first delay clock signal CLKD1 and may output the inversion-driven first delay clock signal CLKD1 to the common node CN. The second driver 320 may receive the second delay clock signal CLKD2 and the second selection signal SEL<2>. When the second selection signal SEL<2> is enabled, the second driver 320 may drive the second delay clock signal CLKD2 and may output the driven second delay clock signal CLKD2 to the common node CN. The second driver 320 may be an inverter. When the second selection signal SEL<2> has a logic high level and a complementary signal SELB<2> of the second selection signal SEL<2> has a logic low level, the second driver 320 may inversion-drive the second delay clock signal CLKD2 and may output the inversion-driven second delay clock signal CLKD2 to the common node CN. Phases of the clock signals respectively output from the first driver 310 and the second driver 320 may be mixed at the common node CN. The third driver 330 may be coupled to the common node CN. The third driver 330 may drive the clock signal provided through the common node CN to output the driven clock signal as the output clock signal CLKO. When the first selection signal SEL<1> is enabled but the second selection signal SEL<2> is disabled, the second driver 320 may be deactivated and the first driver 310 may drive the first delay clock signal CLKD1 to output the driven first delay clock signal CLKD1 to the common node CN. The third driver 330 may drive the driven first delay clock signal CLKD1 to generate the output clock signal CLKO. The output clock signal CLKO may have a phase corresponding to the first delay clock signal CLKD1. When the second selection signal SEL<2> is enabled but the first selection signal SEL<1> is disabled, the first driver 310 may be deactivated and the second driver 320 may drive the second delay clock signal CLKD2 to output the driven second delay clock signal CLKD2 to the common node CN. The third driver 330 may drive the driven second delay clock signal CLKD2 to generate the output clock signal CLKO. The output clock signal CLKO may have a phase corresponding to the second delay clock signal CLKD2. When both the first selection signal SEL<1> and the second selection signal SEL<2> are enabled, the first driver 310 may drive the first delay clock signal CLKD1 to output the driven first delay clock signal CLKD1 to the common node CN and the second driver 320 may drive the second delay clock signal CLKD2 to output the driven second delay clock signal CLKD2 to the common node CN. The phases of the driven first delay clock signal CLKD1 and the driven second delay clock signal CLKD2 may be mixed at the common node CN. The third driver 330 may drive the clock signal having the phase, which is mixed at the common node CN, to generate the output clock signal CLKO. The output clock signal CLKO may have a phase corresponding to a middle of the phase difference between the first delay clock signal CLKD1 and the second delay clock signal CLKD2.

The clock generating circuit 100 may improve the quality of the output clock signal CLKO by monitoring the characteristics of the first delay line 111 and the second delay line 112 in the monitoring mode and selectively utilizing a delay line having a good characteristic between the first delay line 111 and the second delay line 112. When both the first delay line 111 and the second delay line 112 have good characteristics, the quality of the output clock signal CLKO may be guaranteed even when any delay line is utilized between the first delay line 111 and the second delay line 112. When one has a worse characteristic than the other one between the first delay line 111 and the second delay line 112, the other delay line having a better characteristic may be utilized to between the first delay line 111 and the second delay line 112 to generate the output clock signal CLKO thereby guaranteeing the quality of the output clock signal CLKO. When both the first delay line 111 and the second delay line 112 have bad characteristics, both the first delay line 111 and the second delay line 112 may be utilized and the phases of the first delay clock signal CLKD1 and the second delay clock signal CLKD2 may be mixed to generate the output clock signal CLKO. In this case, deterioration of the quality of the output clock signal CLKO may be minimized at a cost of more power for utilizing both the first delay line 111 and the second delay line 112.

Figure 4:
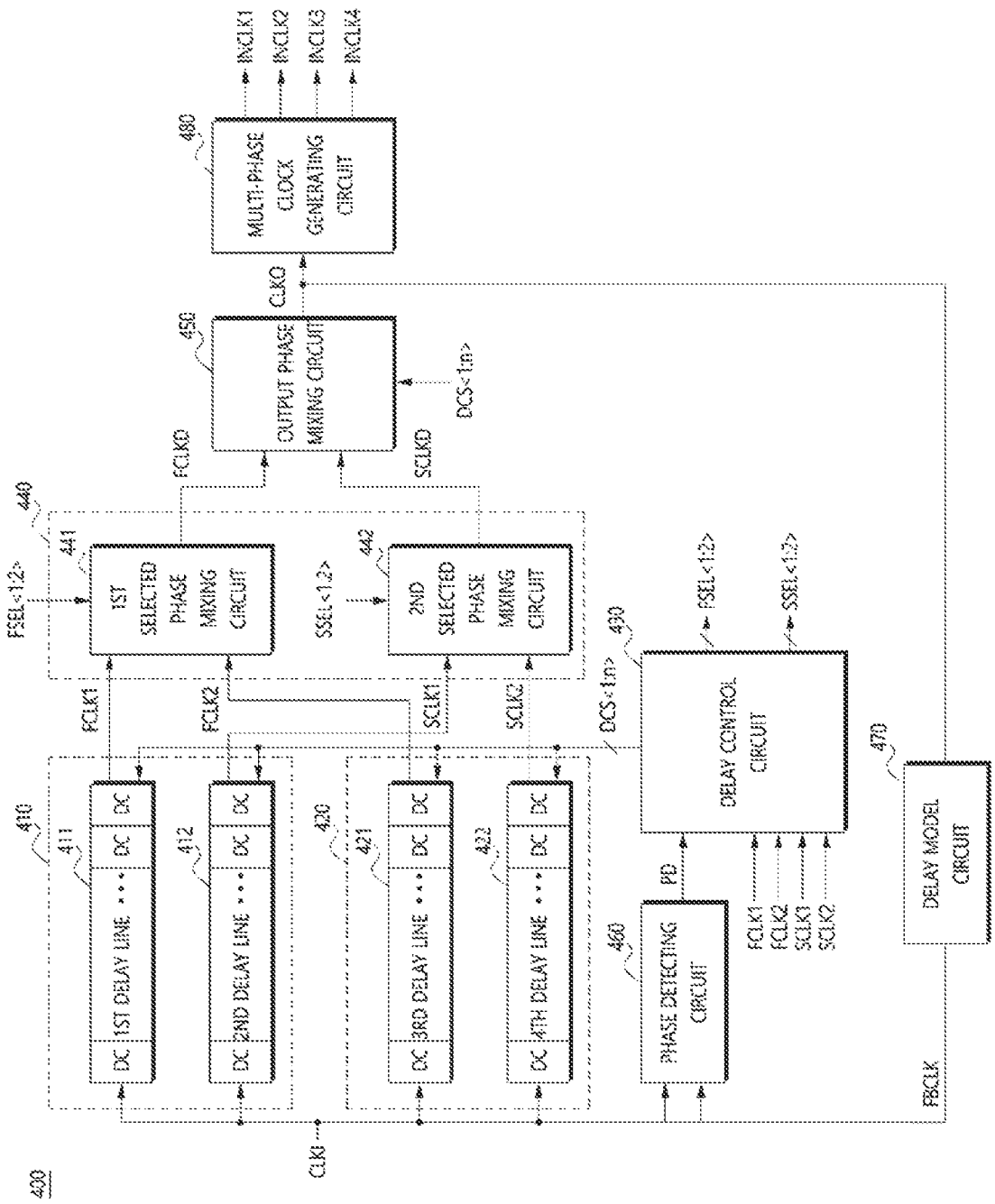
FIG. 4 is a diagram illustrating a configuration of a clock generating circuit according to an embodiment.

FIG. 4 is a diagram illustrating a configuration of a clock generating circuit 400 according to an embodiment, Referring to FIG. 4, the clock generating circuit 400 may receive the input clock signal CLKI to generate an output clock signal CLKO. The clock generating circuit 400 may variably delay the input clock signal CLKI to generate the output clock signal CLKO. The clock generating circuit 400 may perform a delay locked loop operation on the input clock signal CLKI to generate a first phase clock signal FCLKD and a second phase clock signal SCLKD. The clock generating circuit 400 may include at least two numbers of dual delay lines 410 and 420 configured to variably delay the input clock signal CLKI. The two dual delay lines 410 and 420 may have the same structure to perform the same operation. However, characteristics of the two dual delay lines 410 and 420 may become different from each other due to the local variation.

The clock generating circuit 400 may include a first dual delay line 410, a second dual delay line 420, a delay control circuit 430 and a selected phase mixing circuit 440. The first dual delay line 410 may be a main delay line. The first dual delay line 410 may include a first delay line 411 and a second delay line 412. Within the first dual delay line 410, the first delay line 411 may delay the input clock signal CLKI to generate a first delay clock signal FCLK1 and the second delay line 412 may delay the input clock signal CLKI to generate a second delay clock signal SCLK1. The first delay line 411 and the second delay line 412 may commonly receive a delay control signal DCS<1:n>. The delay amounts of the first delay line 411 and the second delay line 412 may change based on the delay control signal DCS<1:n>. The delay amounts of the first delay line 411 and the second delay line 412 may have a fixed difference. For example, a delay amount corresponding to the fixed difference may be a unit amount of time. Each of the first delay line 411 and the second delay line 412 may have a plurality of delay cells DC. A delay amount of each of the plurality of delay cells DC may correspond to the unit amount of time, Based on the delay control signal DCS<1:n>, the first delay line 411 may delay the input clock signal CLKI to generate the first delay clock signal FCLK1. Based on the delay control signal DCS<1:n>, the second delay line 412 may delay the input clock signal CLKI to generate the second delay clock signal SCLK1. The first delay clock signal FCLK1 and the second delay clock signal SCLK1 may have a phase difference corresponding to the unit amount of time. For example, the first delay clock signal FCLK1 may have a phase leading the second delay clock signal SCLK1 by the unit amount of time.

The second dual delay line 420 may be an auxiliary delay line. The second dual delay line 420 may include a third delay line 421 and a fourth delay line 422. Within the second dual delay line 420, the third delay line 421 may delay the input clock signal CLKI to generate a third delay clock signal FCLK2 and the fourth delay line 422 may delay the input clock signal CLKI to generate a fourth delay clock signal SCLK2. The third delay line 421 and the fourth delay line 422 may commonly receive the delay control signal DCS<1:n>. The delay amounts of the third delay line 421 and the fourth delay line 422 may change based on the delay control signal DCS<1:n>. The delay amounts of the third delay line 421 and the fourth delay line 422 may have a fixed difference. For example, a delay amount corresponding to the fixed difference may be the unit amount of time. The third delay line 421 may have the same structure to perform the same operation as the first delay line 411. Ideally, the third delay clock signal FCLK2 generated by the third delay line 421 may have the same phase as the first delay clock signal FCLK1 generated by the first delay line 411. The fourth delay line 422 may have the same structure to perform the same operation as the second delay line 412, Ideally, the fourth delay clock signal SCLK2 generated by the fourth delay line 422 may have the same phase as the second delay clock signal SCLK1 generated by the second delay line 412. Based on the delay control signal DCS<1:n>, the third delay line 421 may delay the input clock signal CLKI to generate the third delay clock signal FCLK2. Based on the delay control signal DCS<1:n>, the fourth delay line 422 may delay the input clock signal CLKI to generate the fourth delay clock signal SCLK2. The third delay clock signal FCLK2 and the fourth delay clock signal SCLK2 may have a phase difference corresponding to the unit amount of time. For example, the third delay clock signal FCLK2 may have a phase leading the fourth delay clock signal SCLK2 by the unit amount of time.

The delay control circuit 430 may receive the first to fourth delay clock signals FCLK1, SCLK1, FCLK2 and SCLK2. The delay control circuit 430 may monitor the duty cycle of each of the first to fourth delay clock signals FCLK1, SCLK1, FCLK2 and SCLK2, The delay control circuit 430 may monitor the duty cycle of each of the first to fourth delay clock signals FCLK1, SCLK1, FCLK2 and SCLK2 to generate a first selection signal FSEL<1>, a second selection signal SSEL<1>, a third selection signal FSEL<2> and a fourth selection signal SSEL<2>, respectively. The delay control circuit 430 may monitor the duty cycle of the first delay clock signal FCLK1 and may selectively enable the first selection signal FSEL<1> according to a result of the monitoring. The delay control circuit 430 may monitor the duty cycle of the second delay clock signal SCLK1 and may selectively enable the second selection signal SSEL<1> according to a result of the monitoring. The delay control circuit 430 may monitor the duty cycle of the third delay clock signal FCLK2 and may selectively enable the third selection signal FSEL<2> according to a result of the monitoring. The delay control circuit 430 may monitor the duty cycle of the fourth delay clock signal SCLK2 and may selectively enable the fourth selection signal SSEL<2> according to a result of the monitoring. It may be a monitoring mode, in which the delay control circuit 430 may monitor the duty cycle of each of the first to fourth delay clock signals FCLK1, SCLK1, FCLK2 and SCLK2. In the monitoring mode, the clock generating circuit 400 may determine the characteristics of the first to fourth delay lines 411, 412, 421 and 422 by monitoring the duty cycle of each of the first to fourth delay clock signals FCLK1, SCLK1, FCLK2 and SCLK2 that are respectively output from the first to fourth delay lines 411, 412, 421 and 422, and, according to a result of the determination, may select at least one between the first delay line 411 and the third delay line 421 and at least one between the second delay line 412 and the fourth delay line 422. The delay control circuit 430 may generate the delay control signal DCS<1:n> based on a result of the monitoring of the duty cycle. The delay control circuit 430 may gradually increase or decrease a value of the delay control signal DCS<1:n> whenever generating the result of the monitoring of the duty cycle of each of the first to fourth delay clock signals FCLK1, SCLK1, FCLK2 and SCLK2.

The delay control circuit 430 may detect the duty cycle of the first delay clock signal FCLK1 to determine the characteristic of the first delay line 411. The delay control circuit 430 may determine the characteristic of the first delay line 411 according to an amount of change in the duty cycle of the first delay clock signal FCLK1. The delay control circuit 430 may selectively enable the first selection signal FSEL<1> according to the determined characteristic of the first delay line 411. For example, the delay control circuit 430 may disable the first selection signal FSEL<1> when the amount of change is great in the duty cycle of the first delay clock signal FCLK1, and may enable the first selection signal FSEL<1> when the amount of change is small in the duty cycle of the first delay clock signal FCLK1. The delay control circuit 430 may detect the duty cycle of the first delay clock signal FCLK1 to determine whether the duty cycle of the first delay clock signal FCLK1 changes within a reference range. The delay control circuit 430 may enable the first selection signal FSEL<1> when the duty cycle of the first delay clock signal FCLK1 changes within the reference range. The delay control circuit 430 may disable the first selection signal FSEL<1> when the duty cycle of the first delay clock signal FCLK1 changes beyond the reference range. The reference range may be a value that is arbitrarily set.

The delay control circuit 430 may detect the duty cycle of the second delay clock signal SCLK1 to determine the characteristic of the second delay line 412. The delay control circuit 430 may determine the characteristic of the second delay line 412 according to an amount of change in the duty cycle of the second delay clock signal SCLK1. The delay control circuit 430 may selectively enable the second selection signal SSEL<1> according to the determined to characteristic of the second delay line 412. For example, the delay control circuit 430 may disable the second selection signal SSEL<1> when the amount of change is great in the duty cycle of the second delay clock signal SCLK1, and may enable the second selection signal SSEL<1> when the amount of change is small in the duty cycle of the second delay clock signal SCLK1. The delay control circuit 430 may detect the duty cycle of the second delay clock signal SCLK1 to determine whether the duty cycle of the second delay clock signal SCLK1 changes within the reference range. The delay control circuit 430 may enable the second selection signal SSEL<1> when the duty cycle of the second delay clock signal SCLK1 changes within the reference range. The delay control circuit 430 may disable the second selection signal SSEL<1> when the duty cycle of the second delay clock signal SCLK1 changes beyond the reference range.

The delay control circuit 430 may detect the duty cycle of the third delay clock signal FCLK2 to determine the characteristic of the third delay line 421. The delay control circuit 430 may determine the characteristic of the third delay line 421 according to an amount of change in the duty cycle of the third delay clock signal FCLK2. The delay control circuit 430 may selectively enable the third selection signal FSEL<2> according to the determined characteristic of the third delay line 421. For example, the delay control circuit 430 may disable the third selection signal FSEL<2> when the amount of change is great in the duty cycle of the third delay clock signal FCLK2, and may enable the third selection signal FSEL<2> when the amount of change is small in the duty cycle of the third delay clock signal FCLK2. The delay control circuit 430 may detect the duty cycle of the third delay clock signal FCLK2 to determine whether the duty cycle of the third delay clock signal FCLK2 changes within the reference range. The delay control circuit 430 may enable the third selection signal FSEL<2> when the duty cycle of the third delay clock signal FCLK2 changes within the reference range. The delay control circuit 430 may disable the third selection signal FSEL<2> when the duty cycle of the third delay clock signal FCLK2 changes beyond the reference range. The reference range may be a value that is arbitrarily set.

The delay control circuit 430 may detect the duty cycle of the fourth delay clock signal SCLK2 to determine the characteristic of the fourth delay line 422. The delay control circuit 430 may determine the characteristic of the fourth delay line 422 according to an amount of change in the duty cycle of the fourth delay clock signal SCLK2. The delay control circuit 430 may selectively enable the fourth selection signal SSEL<2> according to the determined characteristic of the fourth delay line 422. For example, the delay control circuit 430 may disable the fourth selection signal SSEL<2> when the amount of change is great in the duty cycle of the fourth delay clock signal SCLK2, and may enable the fourth selection signal SSEL<2> when the amount of change is small in the duty cycle of the fourth delay clock signal SCLK2. The delay control circuit 430 may detect the duty cycle of the fourth delay clock signal SCLK2 to determine whether the duty cycle of the fourth delay clock signal SCLK2 changes within the reference range. The delay control circuit 430 may enable the fourth selection signal SSEL<2> when the duty cycle of the fourth delay clock signal SCLK2 changes within the reference range. The delay control circuit 430 may disable the fourth selection signal SSEL<2> when the duty cycle of the fourth delay clock signal SCLK2 changes beyond the reference range.

When both the duty cycles of the first delay clock signal FCLK1 and the third delay clock signal FCLK2 change within the reference range, the delay control circuit 430 may enable at least one between the first selection signal FSEL<1> and the third selection signal FSEL<2>. For example, the delay control circuit 430 may enable the first selection signal FSEL<1> while disabling the third selection signal FSEL<2>. When both the duty cycles of the first delay clock signal FCLK1 and the third delay clock signal FCLK2 change beyond the reference range, the delay control circuit 430 may enable both the first selection signal FSEL<1> and the third selection signal FSEL<2>. When both the duty cycles of the second delay clock signal SCLK1 and the fourth delay clock signal SCLK2 change within the reference range, the delay control circuit 430 may enable at least one between the second selection signal SSEL<1> and the fourth selection signal SSEL<2>. For example, the delay control circuit 430 may enable the second selection signal SSEL<1> while disabling the fourth selection signal SSEL<2>. When both the duty cycles of the second delay clock signal SCLK1 and the fourth delay clock signal SCLK2 change beyond the reference range, the delay control circuit 430 may enable both the second selection signal SSEL<1> and the fourth selection signal SSEL<2>.

The selected phase mixing circuit 440 may receive the first to fourth delay clock signals FCLK1, SCLK1, FCLK2 and SCLK2 respectively from the first to fourth delay lines 411, 412, 421 and 422. The selected phase mixing circuit 440 may receive the first to fourth selection signals FSEL<1>, SSEL<1>, FSEL<2> and SSEL<2> from the delay control circuit 430. Based on the first to fourth selection signals FSEL<1>, SSEL<1>, FSEL<2> and SSEL<2>, the selected phase mixing circuit 440 may generate the first phase clock signal FCLKD from at least one between the first delay clock signal FCLK1 and the third delay clock signal FCLK2 and may generate the second phase clock signal SCLKD from at least one between the second delay clock signal SCLK1 and the fourth delay clock signal SCLK2.

The selected phase mixing circuit 440 may include a first selected phase mixing circuit 441 and a second selected phase mixing circuit 442. The first selected phase mixing circuit 441 may receive the first delay clock signal FCLK1, the third delay clock signal FCLK2, the first selection signal FSEL<1> and the third selection signal FSEL<2> to generate the first phase clock signal FCLKD, Based on the first selection signal FSEL<1> and the third selection signal FSEL<2>, the first selected phase mixing circuit 441 may generate the first phase clock signal FCLKD from at least one between the first delay clock signal FCLK1 and the third delay clock signal FCLK2. The first selected phase mixing circuit 441 may select at least one between the first delay clock signal FCLK1 and the third delay clock signal FCLK2 based on the first selection signal FSEL<1> and the third selection signal FSEL<2>. The first selected phase mixing circuit 441 may generate the first phase clock signal FCLKD from the selected delay clock signal between the first delay clock signal FCLK1 and the third delay clock signal FCLK2 or may generate the first phase clock signal FCLKD by mixing phases of the first delay clock signal FCLK1 and the third delay clock signal FCLK2. When the first selection signal FSEL<1> is enabled, the first selected phase mixing circuit 441 may drive the first delay clock signal FCLK1 and generate the driven first delay clock signal as the first phase clock signal FCLKD. When the third selection signal FSEL<2> is enabled, the first selected phase mixing circuit 441 may drive the third delay clock signal FCLK2 and generate the driven third delay clock signal as the first phase clock signal FCLKD. When both the first selection signal FSEL<1> and the third selection signal FSEL<2> are enabled, the first selected phase mixing circuit 441 may mix the phases of the first delay clock signal FCLK1 and the third delay clock signal FCLK2 and generate the phase mixed clock signal as the first phase clock signal FCLKD.

The second selected phase mixing circuit 442 may receive the second delay clock signal SCLK1, the fourth delay clock signal SCLK2, the second selection signal SSEL<1> and the fourth selection signal SSEL<2> to generate the second phase clock signal SCLKD. Based on the second selection signal SSEL<1> and the fourth selection signal SSEL<2>, the second selected phase mixing circuit 442 may generate the second phase clock signal SCLKD from at least one between the second delay clock signal SCLK1 and the fourth delay clock signal SCLK2. The second selected phase mixing circuit 442 may select at least one between the second delay clock signal SCLK1 and the fourth delay clock signal SCLK2 based on the second selection signal SSEL<1> and the fourth selection signal SSEL<2>. The second selected phase mixing circuit 442 may generate the second phase clock signal SCLKD from the selected delay clock signal between the second delay clock signal SCLK1 and the fourth delay clock signal SCLK2 or may generate the second phase clock signal SCLKD by mixing phases of the second delay clock signal SCLK1 and the fourth delay clock signal SCLK2. When the second selection signal SSEL<1> is enabled, the second selected phase mixing circuit 442 may drive the second delay clock signal SCLK1 and generate the driven second delay clock signal as the second phase clock signal SCLKD. When the fourth selection signal SSEL<2> is enabled, the second selected phase mixing circuit 442 may drive the fourth delay clock signal SCLK2 and generate the driven fourth delay clock signal as the second phase clock signal SCLKD. When both the second selection signal SSEL<1> and the fourth selection signal SSEL<2> are enabled, the second selected phase mixing circuit 442 may mix the phases of the second delay clock signal SCLK1 and the fourth delay clock signal SCLK2 and generate the phase mixed clock signal as the second phase clock signal SCLKD.

The clock generating circuit 400 may further include an output phase mixing circuit 450 and a phase detecting circuit 460. The output phase mixing circuit 450 and the phase detecting circuit 460 may be operable when the clock generating circuit 400 operates in a normal mode. In the normal mode, the clock generating circuit 400 may perform the delay locked loop operation on the input clock signal CLKI. The clock generating circuit 400 may enter the normal mode after the characteristics of the first to fourth delay lines 411, 412, 421 and 422 are determined in the monitoring mode. In an embodiment, the clock generating circuit 400 may enter the normal mode before entering the monitoring mode or may enter both the normal mode and the monitoring mode at the same time. In the normal mode, the clock generating circuit 400 may perform the delay locked loop operation on the input clock signal CLKI to variably delay the input clock signal CLKI thereby generating the output clock signal CLKO.

The output phase mixing circuit 450 may receive the first phase clock signal FCLKD, the second phase clock signal SCLKD and the delay control signal DCS<1:n> to generate the output clock signal CLKO. Based on the delay control signal DCS<1:n>, the output phase mixing circuit 450 may mix the phases of the first phase clock signal FCLKD and the second phase clock signal SCLKD to generate the output clock signal CLKO. The output phase mixing circuit 450 may be a phase mixer configured to mix the phases of the first phase clock signal FCLKD and the second phase clock signal SCLKD based on a weight according to the delay control signal DCS<1:n>.

The phase detecting circuit 460 may receive the input clock signal CLKI and a feedback clock signal FBCLK, which is generated by delaying the output clock signal CLKO by an amount of modelled delay time. The clock generating circuit 400 may further include a delay model circuit 470. The delay model circuit 470 may be a delay circuit having a delay amount corresponding to the modelled delay time. The modelled delay time may be arbitrarily set. The delay model circuit 470 may delay the output clock signal CLKO by the amount of the modelled delay time to generate the feedback clock signal FBCLK. The phase detecting circuit 460 may detect the phases of the feedback clock signal FBCLK and the input clock signal CLKI to generate a phase detection signal PD. The phase detecting circuit 460 may compare the phases of the input clock signal CLKI and the feedback clock signal FBCLK with each other to generate the phase detection signal PD having different logic levels. For example, the phase detecting circuit 460 may generate the phase detection signal PD having a logic high level when the phase of the input clock signal CLKI leads the phase of the feedback clock signal FBCLK. Also, the phase detecting circuit 460 may generate the phase detection signal PD having a logic low level when the phase of the input clock signal CLKI lags behind the phase of the feedback clock signal FBCLK.

The delay control circuit 430 may further receive the phase detection signal PD from the phase detecting circuit 460. The delay control circuit 430 may change the delay control signal DCS<1:n> based on the phase detection signal PD. The clock generating circuit 400 may perform a coarse delay lock operation and a fine delay lock operation in order to perform a delay lock operation in the normal mode. The delay control signal DCS<1: n> that the first to fourth delay lines 411, 412, 421 and 422 receive may be a coarse delay control signal. The delay control circuit 430 may change, based on the phase detection signal PD, the value of the coarse delay control signal during the coarse delay lock operation. When the coarse delay lock operation is completed and setting of the delay amounts of the first to fourth delay lines 411, 412, 421 and 422 is completed, the fine delay lock operation may be performed. The delay control signal DCS<1:n> that the output phase mixing circuit 450 receives may be a fine delay control signal. The delay control circuit 430 may change, based on the phase detection signal PD, the value of the fine delay control signal during the fine delay lock operation.

The clock generating circuit 400 may further include a multi-phase clock generating circuit 480. The multi-phase clock generating circuit 480 may receive the output clock signal CLKO to generate a plurality of internal clock signals. The multi-phase clock generating circuit 480 may generate the plurality of internal clock signals with or without division of the frequency of the output clock signal CLKO. The plurality of internal clock signals may have different phases from one another but the phases thereof may be synchronized with the edge of the output clock signal CLKO. For example, the mufti-phase clock generating circuit 480 may generate first to fourth internal clock signals INCLK1, INCLK2, INCLK3 and INCLK4 from the output clock signal CLKO. The first to fourth internal clock signals INCLK1, INCLK2, INCLK3 and INCLK4 may sequentially have a phase difference corresponding to 90°. The first internal clock signal INCLK1 may have a phase leading the second internal clock signal INCLK2 by an amount of 90°, the second internal clock signal INCLK2 may have a phase leading the third internal clock signal INCLK3 by an amount of 90°, the third internal clock signal INCLK3 may have a phase leading the fourth internal clock signal INCLK4 by an amount of 90° and the fourth internal clock signal INCLK4 may have a phase leading the first internal clock signal INCLK1 by an amount of 90°.

Figure 5:
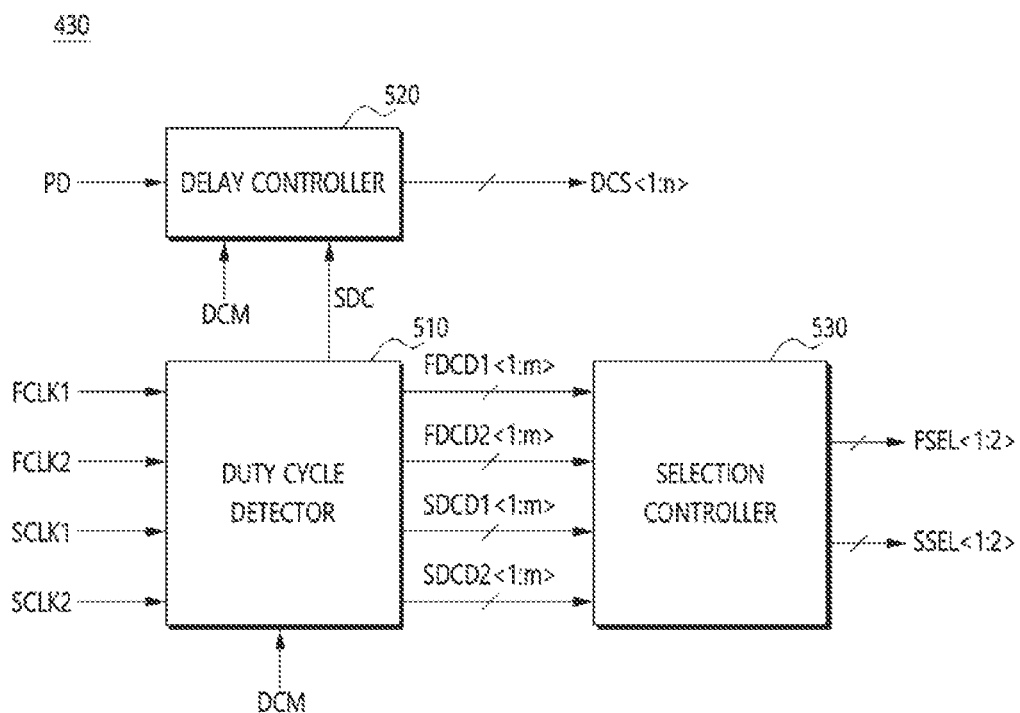
FIG. 5 is a diagram illustrating a configuration of a delay control circuit illustrated in FIG. 4.

FIG. 5 is a diagram illustrating a configuration of the delay control circuit 430 illustrated in FIG. 4. Referring to FIG. 5, the delay control circuit 430 may include a duty cycle detector 510, a delay controller 520 and a selection controller 530. The duty cycle detector 510 may receive the first delay clock signal FCLK1, the second delay clock signal SCLK1, the third delay clock signal FCLK2 and the fourth delay clock signal SCLK2. The duty cycle detector 510 may generate a first duty detection signal FDCD1<1:m>, a second duty detection signal SDCD1<1:m>, a third duty detection signal FDCD2<1:m> and a fourth duty detection signal SDCD2<1:m> based on the first to fourth delay clock signals FCLK1, SCLK1, FCLK2 and SCLK2. The duty cycle detector 510 may detect the duty cycle of the first delay clock signal FCLK1 to generate the first duty detection signal FDCD1<1:m> and may detect the duty cycle of the second delay clock signal SCLK1 to generate the second duty detection signal SDCD1<1:m>. The duty cycle detector 510 may detect the duty cycle of the third delay clock signal FCLK2 to generate the third duty detection signal FDCD2<1:m> and may detect the duty cycle of the fourth delay clock signal SCLK2 to generate the fourth duty detection signal SDCD2<1:m>. Each of the first to fourth duty detection signals FDCD1<1:m>, SDCD1<1:m>, FDCD2<1:m> and SDCD2<1:m> may be a digital code signal having plural bits. The first to fourth duty detection signals FDCD1<1:m>, SDCD1<1:m>, FDCD2<1:m> and SDCD2<1:m> may have logic values changing according to the duty cycles of the first to fourth delay clock signals FCLK1, SCLK1, FCLK2 and SCLK2, respectively. The duty cycle detector 510 may generate a step control signal SDC whenever detecting the duty cycles of the first to fourth delay clock signals FCLK1, SCLK1, FCLK2 and SCLK2. The duty cycle detector 510 may generate the step control signal SDC whenever generating the first to fourth duty detection signals FDCD1<1:m>, SDCD1<1:m>, FDCD2<1:m> and SDCD2<1:m>. The step control signal SDC may be provided to the delay controller 520. The duty cycle detector 510 may further receive an operation mode signal DCM. When the operation mode signal DCM is enabled, the duty cycle detector 510 may be activated to detect the duty cycles of the first to fourth delay clock signals FCLK1, SCLK1, FCLK2 and SCLK2 thereby generating the step control signal SDC. When the operation mode signal DCM is disabled, the duty cycle detector 510 may be deactivated not to detect the duty cycles of the first to fourth delay clock signals FCLK1, SCLK1, FCLK2 and SCLK2 thereby not generating the step control signal SDC.

The delay controller 520 may receive the phase detection signal PD. The delay controller 520 may generate the delay control signal DCS<1:n> based on the phase detection signal PD. The delay controller 520 may increase or decrease the value of the delay control signal DCS<1:n> according to the logic level of the phase detection signal PD. The delay controller 520 may receive the step control signal SDC from the duty cycle detector 510. The delay controller 520 may change the value of the delay control signal DCS<1:n> based on the step control signal SDC. The delay controller 520 may gradually increase or decrease the value of the delay control signal DCS 1:n> whenever receiving the step control signal SDC. The delay controller 520 may further receive the operation mode signal DCM. When the operation mode signal DCM is enabled, the delay controller 520 may initialize the delay control signal DCS<1:n> and may gradually change the value of the delay control signal DCS<1:n> based on the step control signal SDC. When the operation mode signal DCM is disabled, the delay controller 520 may change the value of the delay control signal DCS<1:n> based on the phase detection signal PD.

The selection controller 530 may receive the first to fourth duty detection signals FDCD1<1:m>, SDCD1<1:m>, FDCD2<1:m> and SDCD2<1:m> from the duty cycle detector 510. The selection controller 530 may accumulate and store the first to fourth duty detection signals FDCD1<1:m>, SDCD1<1:m>, FDCD2<1:m> and SDCD2<1:m>. The selection controller 530 may selectively enable the first to fourth selection signals FSEL<1>, SSEL<1>, FSEL<2> and SSEL<2> based on the first to fourth duty detection signals FDCD1<1:m>, SDCD1<1:m>, FDCD2<1:m> and SDCD2<1:m>, which are accumulated and stored. When the first duty detection signal FDCD1<1:m> changes within the reference range, the selection controller 530 may determine the first delay line 411 to have a good characteristic and may enable the first selection signal FSEL<1>. When the first duty detection signal FDCD1<1:m> changes beyond the reference range, the selection controller 530 may determine the first delay line 411 to have a bad characteristic and may disable the first selection signal FSEL<1>. When the second duty detection signal SDCD1<1:m> changes within the reference range, the selection controller 530 may determine the second delay line 412 to have a good characteristic and may enable the second selection signal SSEL<1>. When the second duty detection signal SDCD1<1:m> changes beyond the reference range, the selection controller 530 may determine the second delay line 412 to have a bad characteristic and may disable the second selection signal SSEL<1>. When the third duty detection signal FDCD2<1:m> changes within the reference range, the selection controller 530 may determine the third delay line 421 to have a good characteristic and may enable the third selection signal FSEL<2>. When the third duty detection signal FDCD2<1:m> changes beyond the reference range, the selection controller 530 may determine the third delay line 421 to have a bad characteristic and may disable the third selection signal FSEL<2>. When the fourth duty detection signal SDCD2<1:m> changes within the reference range, the selection controller 530 may determine the fourth delay line 422 to have a good characteristic and may enable the fourth selection signal SSEL<2>. When the fourth duty detection signal SDCD2<1:m> changes beyond the reference range, the selection controller 530 may determine the fourth delay line 422 to have a bad characteristic and may disable the fourth selection signal SSEL<2>.

The selection controller 530 may operate as shown in Table 2.

TABLE 2

| FCLK 1 | FCLK 2 | FSEL <1> | FSEL <2> | SCLK 1 | SCLK 2 | SSEL <1> | SSEL <2> |
|---|---|---|---|---|---|---|---|
| Good | Good | Enable | Disable | Good | Good | Enable | Disable |
| Good | Bad | Enable | Disable | Good | Bad | Enable | Disable |
| Bad | Good | Disable | Enable | Bad | Good | Disable | Enable |
| Bad | Bad | Enable | Enable | Bad | Bad | Enable | Enable |

Referring to Table 2, when both the duty cycles of the first delay clock signal FCLK1 and the third delay clock signal FCLK2 change within the reference range, the selection controller 530 may determine both the first delay line 411 and the third delay line 421 to have good characteristics and may enable one between the first selection signal FSEL<1> and the third selection signal FSEL<2>. For example, the selection controller 530 may enable the first selection signal FSEL<1> while disabling the third selection signal FSEL<2>. When the duty cycle of the first delay clock signal FCLK1 changes within the reference range but the duty cycle of the third delay clock signal FCLK2 changes beyond the reference range, the selection controller 530 may determine the first delay line 411 to have a good characteristic but may determine the third delay line 421 to have a bad characteristic. Therefore, the selection controller 530 may enable the first selection signal FSEL<1> while disabling the third selection signal FSEL<2>. When the duty cycle of the third delay clock signal FCLK2 changes within the reference range but the duty cycle of the first delay clock signal FCLK1 changes beyond the reference range, the selection controller 530 may determine the third delay line 421 to have a good characteristic but may determine the first delay line 411 to have a bad characteristic. Therefore, the selection controller 530 may enable the third selection signal FSEL<2> while disabling the first selection signal FSEL<1>. When both the duty cycles of the first delay clock signal FCLK1 and the third delay clock signal FCLK2 change beyond the reference range, the selection controller 530 may determine both the first delay line 411 and the third delay line 421 to have bad characteristics and may enable both the first selection signal FSEL<1> and the third selection signal FSEL<2>.

When both the duty cycles of the second delay clock signal SCLK1 and the fourth delay clock signal SCLK2 change within the reference range, the selection controller 530 may determine both the second delay line 412 and the fourth delay line 422 to have good characteristics and may enable one between the second selection signal SSEL<1> and the fourth selection signal SSEL<2>. For example, the selection controller 530 may enable the second selection signal SSEL<1> while disabling the fourth selection signal SSEL<2>. When the duty cycle of the second delay clock signal SCLK1 changes within the reference range but the duty cycle of the fourth delay clock signal SCLK2 changes beyond the reference range, the selection controller 530 may determine the second delay line 412 to have a good characteristic but may determine the fourth delay line 422 to have a bad characteristic. Therefore, the selection controller 530 may enable the second selection signal SSEL<1> while disabling the fourth selection signal SSEL<2>. When the duty cycle of the fourth delay clock signal SCLK2 changes within the reference range but the duty cycle of the second delay clock signal SCLK1 changes beyond the reference range, the selection controller 530 may determine the fourth delay line 422 to have a good characteristic but may determine the second delay line 412 to have a bad characteristic. Therefore, the selection controller 530 may enable the fourth selection signal SSEL<2> while disabling the second selection signal SSEL<1>. When both the duty cycles of the second delay clock signal SCLK1 and the fourth delay clock signal SCLK2 change beyond the reference range, the selection controller 530 may determine both the second delay line 412 and the fourth delay line 422 to have bad characteristics and may enable both the second selection signal SSEL<1> and the fourth selection signal SSEL<2>.

After monitoring the characteristics of the first to fourth delay lines 411, 412, 421 and 422, the selection controller 530 may fix the states of the first to fourth selection signals FSEL<1>, SSEL<1>, FSEL<2> and SSEL<2>. In an embodiment, the selection controller 530 may include a register or a one-time programmable memory for fixing the states of the first to fourth selection signals FSEL<1>, SSEL<1>, FSEL<2> and SSEL<2>.

Figure 6:
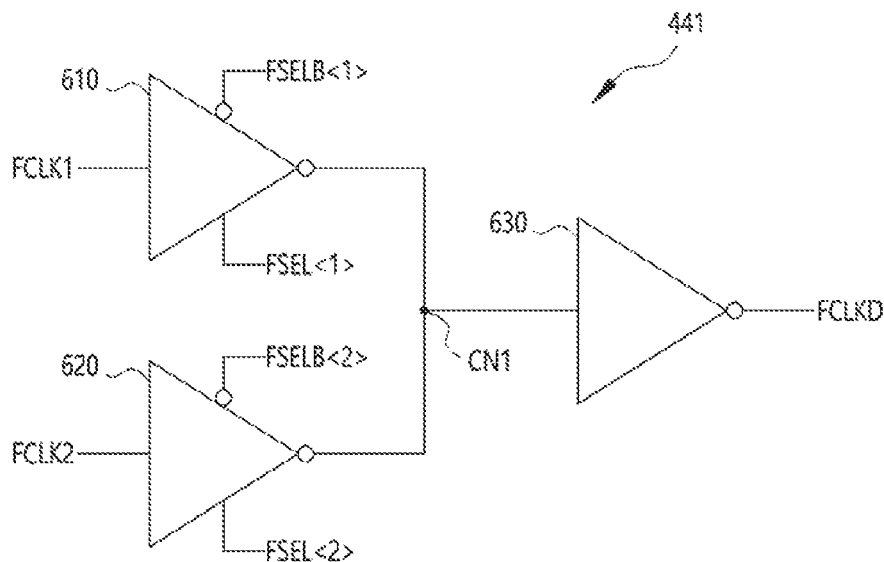
FIG. 6 is a diagram illustrating a configuration of a selected phase mixing circuit illustrated in FIG. 4.
Figure 6:
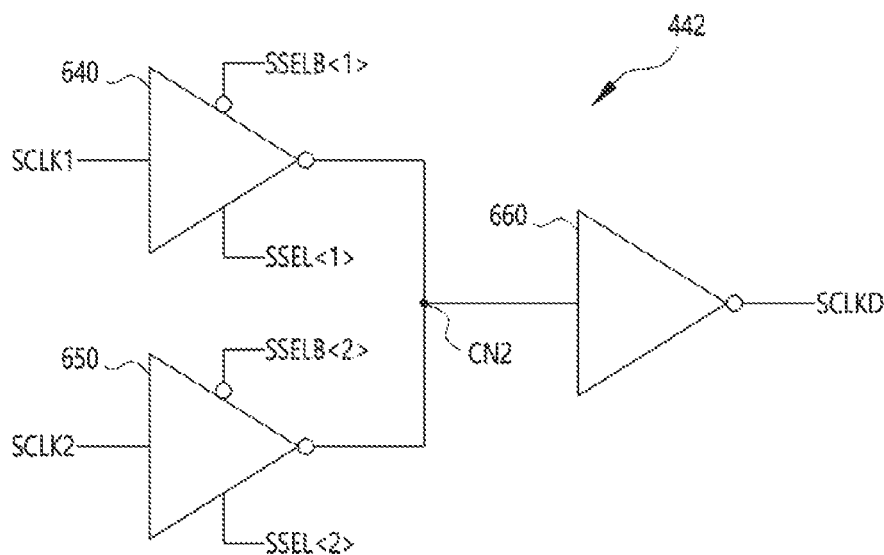

FIG. 6 is a diagram illustrating a configuration of the selected phase mixing circuit 440 illustrated in FIG. 4. Referring to FIG. 6, the first selected phase mixing circuit 441 may include a first driver 610, a second driver 620 and a third driver 630. The first driver 610 may receive the first delay clock signal FCLK1 and the first selection signal FSEL<1>. When the first selection signal FSEL<1> is enabled, the first driver 610 may drive the first delay clock signal FCLK1 and may output the driven first delay clock signal FCLK1 to a first common node CN1. The first driver 610 may be an inverter. When the first selection signal FSEL<1> has a logic high level and a complementary signal FSELB<1> of the first selection signal FSEL<1> has a logic low level, the first driver 610 may inversion-drive the first delay clock signal FCLK1 and may output the inversion-driven first delay clock signal FCLK1 to the first common node CN1, The second driver 620 may receive the third delay clock signal FCLK2 and the third selection signal FSEL<2>. When the third selection signal FSEL<2> is enabled, the second driver 620 may drive the third delay clock signal FCLK2 and may output the driven third delay clock signal FCLK2 to the first common node CN1. The second driver 620 may be an inverter. When the third selection signal FSEL<2> has a logic high level and a complementary signal FSELB<2> of the third selection signal FSEL<2> has a logic low level, the second driver 620 may inversion-drive the third delay clock signal FCLK2 and may output the inversion-driven third delay clock signal FCLK2 to the first common node CN1. Phases of the clock signals respectively output from the first driver 610 and the second driver 620 may be mixed at the first common node CN1. The third driver 630 may be coupled to the first common node CN1. The third driver 630 may drive the clock signal provided through the first common node CN1 to output the driven clock signal as the first phase clock signal FCLKD. When the first selection signal FSEL<1> is enabled but the third selection signal FSEL<2> is disabled, the second driver 620 may be deactivated and the first driver 610 may drive the first delay clock signal FCLK1 to output the driven first delay clock signal FCLK1 to the first common node CN1. The third driver 630 may drive the driven first delay clock signal FCLK1 to generate the first phase clock signal FCLKD. The first phase clock signal FCLKD may have a phase corresponding to the first delay clock signal FCLK1. When the third selection signal FSEL<2> is enabled but the first selection signal FSEL<1> is disabled, the first driver 610 may be deactivated and the second driver 620 may drive the third delay clock signal FCLK2 to output the driven third delay clock signal FCLK2 to the first common node CN1. The third driver 630 may drive the driven third delay clock signal FCLK2 to generate the first phase clock signal FCLKD. The first phase clock signal FCLKD may have a phase corresponding to the third delay clock signal FCLK2. When both the first selection signal FSEL<1> and the third selection signal FSEL<2> are enabled, the first driver 610 may drive the first delay clock signal FCLK1 to output the driven first delay clock signal FCLK1 to the first common node CN1 and the second driver 620 may drive the third delay clock signal FCLK2 to output the driven third delay clock signal FCLK2 to the first common node CN1. The phases of the driven first delay clock signal FCLK1 and the driven third delay clock signal FCLK2 may be mixed at the first common node CN1. The third driver 630 may drive the clock signal having the phase, which is mixed at the first common node CN1, to generate the first phase clock signal FCLKD. The first phase clock signal FCLKD may have a phase corresponding to a middle of the phase difference between the first delay clock signal FCLK1 and the third delay clock signal FCLK2.

The second selected phase mixing circuit 442 may include a fourth driver 640, a fifth driver 650 and a sixth driver 660. The fourth driver 640 may receive the second delay clock signal SCLK1 and the second selection signal SSEL<1>. When the second selection signal SSEL<1> is enabled, the fourth driver 640 may drive the second delay clock signal SCLK1 and may output the driven second delay clock signal SCLK1 to a second common node CN2. The fourth driver 640 may be an inverter. When the second selection signal SSEL<1> has a logic high level and a complementary signal SSELB<1> of the second selection signal SSEL<1> has a logic low level, the fourth driver 640 may inversion-drive the second delay clock signal SCLK1 and may output the inversion-driven second delay clock signal SCLK1 to the second common node CN2. The fifth driver 650 may receive the fourth delay clock signal SCLK2 and the fourth selection signal SSEL<1>. When the fourth selection signal SSEL<2> is enabled, the fifth driver 650 may drive the fourth delay clock signal SCLK2 and may output the driven fourth delay clock signal SCLK2 to the second common node CN2. The fifth driver 650 may be an inverter. When the fourth selection signal SSEL<2> has a logic high level and a complementary signal SSELB<2> of the fourth selection signal SSEL<2> has a logic low level, the fifth driver 650 may inversion-drive the fourth delay clock signal SCLK2 and may output the inversion-driven fourth delay clock signal SCLK2 to the second common node CN2. Phases of the clock signals respectively output from the fourth driver 640 and the fifth driver 650 may be mixed at the second common node CN2. The sixth driver 660 may be coupled to the second common node CN2. The sixth driver 660 may drive the clock signal provided through the second common node CN2 to output the driven clock signal as the second phase clock signal SCLKD. When the second selection signal SSEL<1> is enabled but the fourth selection signal SSEL<2> is disabled, the fifth driver 650 may be deactivated and the fourth driver 640 may drive the second delay clock signal SCLK1 to output the driven second delay clock signal SCLK1 to the second common node CN2. The sixth driver 660 may drive the driven second delay clock signal SCLK1 to generate the second phase clock signal SCLKD. The second phase clock signal SCLKD may have a phase corresponding to the second delay clock signal SCLK1. When the fourth selection signal SSEL<2> is enabled but the second selection signal SSEL<1> is disabled, the fourth driver 640 may be deactivated and the fifth driver 650 may drive the fourth delay clock signal SCLK2 to output the driven fourth delay clock signal SCLK2 to the second common node CN2. The sixth driver 660 may drive the driven fourth delay clock signal SCLK2 to generate the second phase clock signal SCLKD. The second phase clock signal SCLKD may have a phase corresponding to the fourth delay clock signal SCLK2. When both the second selection signal SSEL<1> and the fourth selection signal SSEL<2> are enabled, the fourth driver 640 may drive the second delay clock signal SCLK1 to output the driven second delay clock signal SCLK1 to the second common node CN2 and the fifth driver 650 may drive the fourth delay clock signal SCLK2 to output the driven fourth delay clock signal SCLK2 to the second common node CN2. The phases of the driven second delay clock signal SCLK1 and the driven fourth delay clock signal SCLK2 may be mixed at the second common node CN2. The sixth driver 660 may drive the clock signal having the phase, which is mixed at the second common node CN2, to generate the second phase clock signal SCLKD. The second phase clock signal SCLKD may have a phase corresponding to a middle of the phase difference between the second delay clock signal SCLK1 and the fourth delay clock signal SCLK2.

Figure 7:
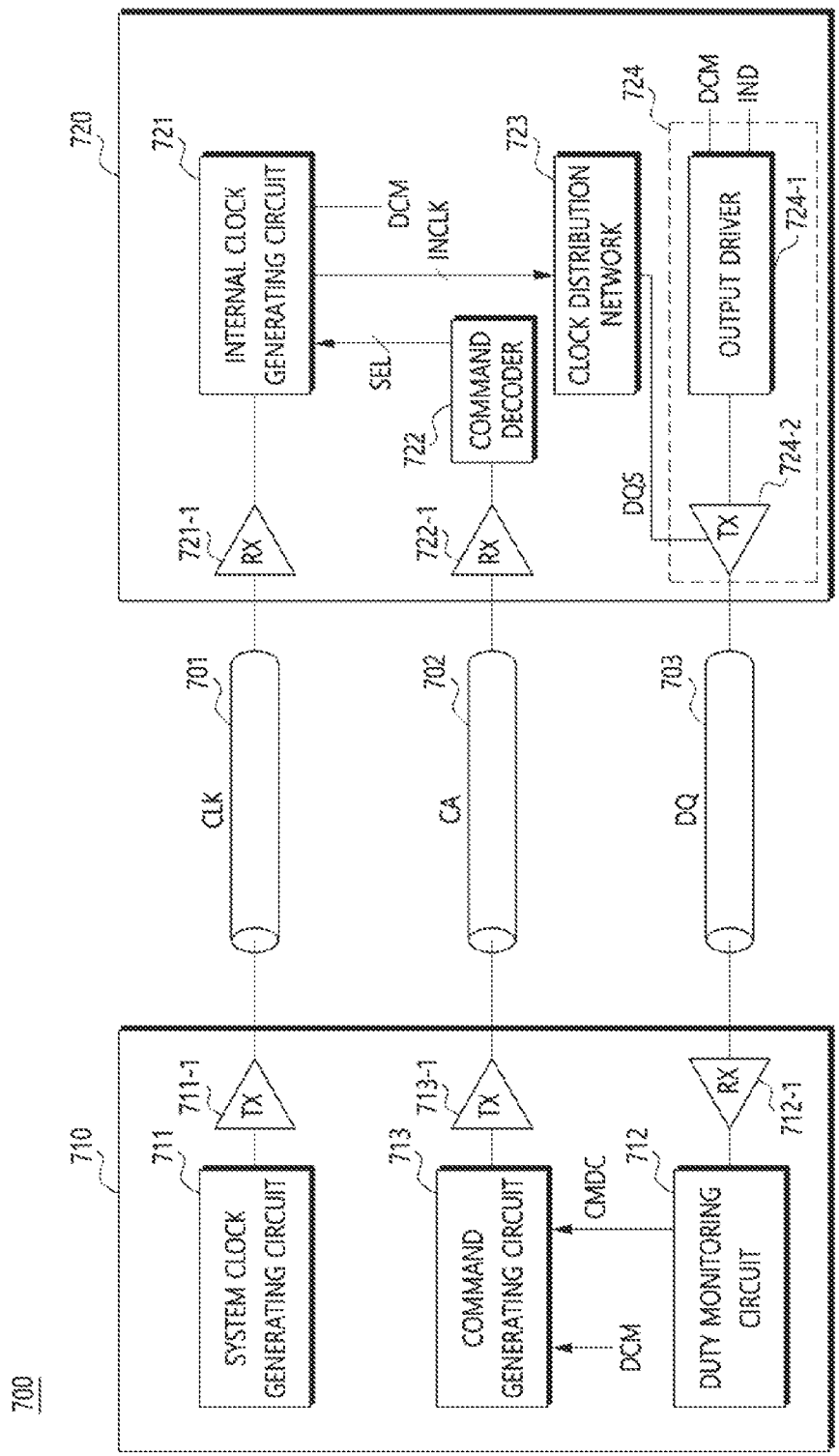
FIG. 7 is a diagram illustrating a configuration of a semiconductor system according to an embodiment.

FIG. 7 is a diagram illustrating a configuration of a semiconductor system 700 according to an embodiment. Referring to FIG. 7, the semiconductor system 700 may include an external apparatus 710 and a semiconductor apparatus 720. The external apparatus 710 may provide various control signals required for the semiconductor apparatus 720 to operate. The external apparatus 710 may include various kinds of devices. For example, the external apparatus 710 may be a host device such as a processor or a controller and may include a central processing unit (CPU), a graphic processing unit (GPU), a multi-media processor (MMP), a digital signal processor, an application processor (AP) and a memory controller. Also, the external apparatus 710 may be a test device or a test equipment configured to test the semiconductor apparatus 720. For example, the semiconductor apparatus 720 may be a memory device and the memory device may include a volatile memory and a non-volatile memory. The volatile memory may include a static random access memory (static RAM: SRAM), a dynamic RAM (DRAM) and a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

The semiconductor apparatus 720 may be coupled to the external apparatus 710 through a plurality of buses. Each of the plurality of buses may be a transmission line, a link or a channel configured to transfer a signal. The plurality of buses may include a clock bus 701, a command address bus 702 and a data bus 703, Each of the clock bus 701 and the command address bus 702 may be a unidirectional bus and the data bus 703 may be a bidirectional bus. The semiconductor apparatus 720 may be coupled to the external apparatus 710 through the clock bus 701 and may receive a system clock signal CLK through the clock bus 701. The system clock signal CLK may include one or more pairs of clock signals. The semiconductor apparatus 720 may receive a command address signal CA through the command address bus 702. The command address signal CA may include plural bits. In synchronization with the system clock signal CLK, the semiconductor apparatus 720 may receive the command address signal CA. The semiconductor apparatus 720 may be coupled to the external apparatus 710 through the data bus 703, The semiconductor apparatus 720 may receive data DQ from the external apparatus 710 through the data bus 703. The semiconductor apparatus 720 may provide data DQ to the external apparatus 710 through the data bus 703.

The external apparatus 710 may include a system clock generating circuit 711, a duty monitoring circuit 712 and a command generating circuit 713. The system clock generating circuit 711 may generate the system clock signal CLK. The system clock generating circuit 711 may include an oscillating circuit such as a phase locked loop circuit capable of generating a clock signal having a predetermined period. The system clock generating circuit 711 may be coupled to the clock bus 701 through a clock transmitter 711-1, The system clock generating circuit 711 may generate the system clock signal CLK and the clock transmitter 711-1 may provide the system clock signal CLK to the external apparatus 710 through the clock bus 701. The word "predetermined" as used herein with respect to a parameter, such as a predetermined period, etc., means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The duty monitoring circuit 712 may receive the data DQ provided from the semiconductor apparatus 720 and may monitor the data DQ. As described later, the duty monitoring circuit 712 may detect the duty cycle and/or a valid duration of the data DQ to monitor the duty cycle of an internal clock signal INCLK generated by the semiconductor apparatus 720. The duty monitoring circuit 712 may be coupled to the data bus 703 through a data receiver 712-1. The data receiver 712-1 may receive the data DQ provided through the data bus 703 and the duty monitoring circuit 712 may monitor the duty cycle and/or the valid duration of the received data DQ. The duty monitoring circuit 712 may detect the duty cycle and/or the valid duration of the data DQ to generate a command control signal CM DC.

The command generating circuit 713 may receive the command control signal CMDC from the duty monitoring circuit 712, The command generating circuit 713 may generate the command address signal CA based on the command control signal CMDC. The command generating circuit 713 may be coupled to the command address bus 702 through a command transmitter 713-1. The command generating circuit 713 may generate the command address signal CA based on the command control signal CMDC and the command transmitter 713-1 may provide the command address signal CA to the semiconductor apparatus 720 through the command address bus 702. The command address signal CA generated by the command generating circuit 713 may include information for generating the selection signals SEL<1:2>, FSEL<1:2> and SSEL<1:2> illustrated in FIGS. 1 and 4. The command generating circuit 713 may further receive an operation mode signal DCM. Based on the operation mode signal DCM, the command generating circuit 713 may generate the command address signal CA for generating various combinations of the selection signals SEL<1:2>, FSEL<1:2> and SSEL<1:2>. For example, when referring to FIG. 1 together, the command generating circuit 713 may generate, in a first section, the command address signal CA for enabling the first selection signal SEL<1> while disabling the second selection signal SEL<2> thereby monitoring the characteristics of the first delay line 111 and the second delay line 112. The command generating circuit 713 may generate, in a second section, the command address signal CA for disabling the first selection signal SEL<1> while enabling the second selection signal SEL<2>. The command generating circuit 713 may generate, in a third section, the command address signal CA for enabling both the first selection signal SEL<1> and the second selection signal SEL<2>.

The semiconductor apparatus 720 may include an internal clock generating circuit 721, a command decoder 722, a clock distribution network 723 and a data output circuit 724. The internal clock generating circuit 721 may be coupled to the clock bus 701 through a clock receiver 721-1 and may generate a plurality of internal clock signals INCLK based on the system clock signal CLK provided through the clock bus 701. One between the clock generating circuits 100 and 400 illustrated in FIGS. 1 and 4 may be applied as the internal clock generating circuit 721. However, apart from the clock generating circuits 100 and 400, the internal clock generating circuit 721 might not generate the selection signals SEL<1:2>, FSEL<1; 2> and SSEL<1:2>. The internal clock generation circuit 721 may receive selection signals SEL, which is generated on the basis of the command address signal CA provided through the command address bus 702. A delay control circuit included in the internal clock generating circuit 721 may be variously modified in order for the internal clock generating circuit 721 to receive the selection signals SEL, which is generated on the basis of the command address signal CA. The internal clock generating circuit 721 may receive the selection signals SEL from the external apparatus 710 and therefore the internal clock generating circuit 721 might not have to be provided with circuits such as the selection controllers 230 and 530 illustrated in FIGS. 2 and 5. For example, the internal clock generating circuit 721 may include only the delay controllers 220 and 520 among the elements included in the delay control circuits 120 and 430 as illustrated in FIGS. 2 and 5. Based on the operation mode signal DCM, the delay controllers 220 and 520 may initialize the delay control signal DCS<1:n> and may gradually increase or decrease, at a predetermined time interval, the value of the delay control signal DCS<1:n> thereby gradually increasing or decreasing a delay amount of a delay line, with which the internal clock generating circuit 721 is provided. The predetermined time interval may correspond to an amount of time that the data DQ is provided, in synchronization with the internal clock signals INCLK generated on the basis of the delay control signal DCS<1:n>, to the external apparatus 710.

The command decoder 722 may be coupled to the command address bus 702 through a command receiver 722-1. The command decoder 722 may receive the command address signal CA, which is provided through the command address bus 702, and may decode the command address signal CA to generate the selection signals SEL.

The clock distribution network 723 may receive the internal clock signals INCLK and may generate a data strobe signal DQS based on the internal clock signals INCLK. The command decoder 723 may drive the internal clock signals INCLK and may distribute the driven internal clock signals INCLK to a plurality of data output circuits (not illustrated). The internal clock signals INCLK driven by the clock distribution network 723 may be provided, as the data strobe signal DQS, to the plurality of data output circuits. Although FIG. 7 exemplifies the single data output circuit 724 coupled to the data bus 703, the semiconductor system 700 may include a plurality of data buses and the semiconductor apparatus 720 may include a plurality of output data circuits respectively coupled to the plurality of data buses. The plurality of data output circuits may commonly receive the data strobe signal DQS.

The data output circuit 724 may be coupled to the data bus 703 and may provide the data DQ to the external apparatus 710 through the data bus 703. The data output circuit 724 may receive Internal data IND and the data strobe signal DQS of the semiconductor apparatus 720, In synchronization with the data strobe signal DQS, the data output circuit 724 may output the internal data IND as the data DQ. The data output circuit 724 may include an output driver 724-1 and a data transmitter 724-2. The output driver 724-1 may receive the internal data IND and the operation mode signal DCM. When the operation mode signal DCM is disabled, that is, in the normal mode, the output driver 724-1 may drive the internal data IND to output the driven internal data IND to the data transmitter 724-2. When the operation mode signal DCM is enabled, that is, in the monitoring mode, the output driver 724-1 may generate data having a predetermined pattern instead of the internal data IND. When the operation mode signal DCM is enabled, the output driver 724-1 may output data, which has a pattern of "1,0,0,0", "0,1,0,0", "0,0,1,0" or "0,0,0,1", to the data transmitter 724-2. In synchronization with the data strobe signal DQS, the data transmitter 724-2 may output the data, which is provided from the output driver 724-1, as the data DQ to the data bus 703. When the internal clock signals INCLK includes the four number of internal clock signals INCLK1, INCLK2, INCLK3 and INCLK4 as described with reference to FIGS. 1 and 4, the duty monitoring circuit 712 may detect a phase skew among the four number of internal clock signals INCLK1, INCLK2, INCLK3 and INCLK4 based on the data DQ having the predetermined pattern and provided from the semiconductor apparatus 720.

Hereinafter, described with reference to FIGS. 1 and 7 will be the operation of the semiconductor system 700 according to an embodiment. In the first section within the monitoring mode, the command generating circuit 713 may generate the command address signal CA to enable the first selection signal SEL<1> while disabling the second selection signal SEL<2>. Based on the first delay clock signal CLKD1, the internal clock generating circuit 721 may generate the internal clock signals INCLK. In synchronization with the data strobe signal DQS generated on the basis of the internal clock signals INCLK, the data output circuit 724 may output the data DQ, which has the predetermined pattern, to the external apparatus 710. The duty monitoring circuit 712 may receive the data DQ provided from the semiconductor apparatus 720 and may detect the duty cycle and/or the valid duration of the data DQ. At the predetermined time interval, the internal clock generating circuit 721 may increase or decrease the delay amounts of the first delay line 111 and the second delay line 112 to generate the internal clock signals INCLK. The duty monitoring circuit 712 may determine whether the first delay line 111 has a good characteristic while accumulating and detecting the duty cycle and/or the valid duration of the data DQ. In the second section within the monitoring mode, the command generating circuit 713 may generate the command address signal CA to enable the second selection signal SEL<2> while disabling the first selection signal SEL<1>. Based on the second delay clock signal CLKD2, the internal clock generating circuit 721 may generate the internal clock signals INCLK. In synchronization with the data strobe signal DQS generated on the basis of the internal clock signals INCLK, the data output circuit 724 may output the data DQ, which has the predetermined pattern, to the external apparatus 710. The duty monitoring circuit 712 may receive the data DQ provided from the semiconductor apparatus 720 and may detect the duty cycle and/or the valid duration of the data DQ. At the predetermined time interval, the internal clock generating circuit 721 may increase or decrease the delay amounts of the first delay line 111 and the second delay line 112 to generate the internal clock signals INCLK. The duty monitoring circuit 712 may determine whether the second delay line 112 has a good characteristic while accumulating and detecting the duty cycle and/or the valid duration of the data DQ. In the third section within the monitoring mode, the command generating circuit 713 may generate the command address signal CA to enable both the first selection signal SEL<1> and the second selection signal SEL<2>. Based on the clock signal having the phase that the phases of the first delay clock signal CLKD1 and the second delay clock signal CLKD2 is mixed, the internal clock generating circuit 721 may generate the internal clock signals INCLK. In synchronization with the data strobe signal DQS generated on the basis of the internal clock signals INCLK, the data output circuit 724 may output the data DQ, which has the predetermined pattern, to the external apparatus 710. The duty monitoring circuit 712 may receive the data DQ provided from the semiconductor apparatus 720 and may detect the duty cycle and/or the valid duration of the data DQ. At the predetermined time interval, the internal clock generating circuit 721 may increase or decrease the delay amounts of the first delay line 111 and the second delay line 112 to generate the internal clock signals INCLK. The duty monitoring circuit 712 may determine, while accumulating and detecting the duty cycle and/or the valid duration of the data DQ, whether a better characteristic is obtained when both the first delay line 111 and the second delay line 112 are utilized together than when any one of the first delay line 111 and the second delay line 112 is utilized. When completing the monitoring of the first delay line 111 and the second delay line 112, the command generating circuit 713 may generate, based on the command control signal CMDC, the command address signal CA in order to select the combination of the first delay line 111 and the second delay line 112 that can generate the internal clock signals INCLK having the best characteristic. The internal clock generating circuit 721 may receive and store therein the selection signals SEL, which are generated on the basis of the command address signal CA. For example, when the first delay line 111 has a good characteristic but the second delay line 112 has a bad characteristic, the command generating circuit 713 may generate the command address signal CA in order to enable the first selection signal SEL<1> while disabling the second selection signal SEL<2>. The internal clock generating circuit 721 store therein the selection signals SEL and may be set to generate, in the normal mode, the internal clock signals INCLK only through the first delay line 111.

While certain embodiments have been described above, it will be understood to those skilled in the art that the embodiments described are by way of example only. Accordingly, the clock generating circuit and a semiconductor system using the same should not be limited based on the described embodiments, Rather, the clock generating circuit and a semiconductor system using the same described herein should only be limited in light of the claims that follow when taken in conjunction with the above description and accompanying drawings.

What is claimed is:

1. A clock generating circuit comprising:
   a first delay line configured to delay, based on a delay control signal, an input clock signal to generate a first delay clock signal;
   a second delay line configured to delay, based on the delay control signal, the input clock signal to generate a second delay clock signal;
   a selected phase mixing circuit configured to generate, based on a first selection signal and a second selection signal, an output clock signal from at least one between the first delay clock signal and the second delay clock signal; and
   a delay control circuit configured to monitor respective duty cycles of the first delay clock signal and the second delay clock signal to generate the first selection signal and the second selection signal and configured to generate the delay control signal based on a result of the monitoring of the duty cycles.

2. The clock generating circuit of claim 1, wherein the delay control circuit is configured to change a value of the delay control signal for the monitoring of the duty cycles of the first delay clock signal and the second delay clock signal.

3. The clock generating circuit of claim 2, wherein the delay control circuit is configured to:
   enable the first selection signal according to whether the duty cycle of the first delay clock signal changes within a reference range, and
   enable the second selection signal according to whether the duty cycle of the second delay clock signal changes within the reference range.

4. The clock generating circuit of claim 3, wherein the selected phase mixing circuit is configured to:
   generate the output clock signal from the first delay clock signal when the first selection signal is enabled, and
   generate the output clock signal from the second delay clock signal when the second selection signal is enabled.

5. The clock generating circuit of claim 3, wherein the selected phase mixing circuit is configured to:
   generate the output clock signal by mixing phases of the first delay clock signal and the second delay clock signal when both the first selection signal and the second selection signal are enabled.

6. The clock generating circuit of claim 1, wherein the selected phase mixing circuit includes:
   a first driver configured to drive, based on the first selection signal, the first delay clock signal and configured to output the driven first delay clock signal to a common node;
   a second driver configured to drive, based on the second selection signal, the second delay clock signal and configured to output the driven second delay clock signal to the common node; and
   a third driver configured to drive a clock signal provided through the common node to generate the output clock signal.

7. The clock generating circuit of claim 1, wherein the delay control circuit includes:
   a duty cycle detector configured to detect the duty cycle of the first delay clock signal to generate a first duty detection signal and configured to detect the duty cycle of the second delay clock signal to generate a second duty detection signal;
   a delay controller configured to gradually change a value of the delay control signal whenever any of the first duty detection signal and the second duty detection signal is generated; and
   a selection controller configured to store values of the first duty detection signal and the second duty detection signal and configured to enable at least one between the first selection signal and the second selection signal based on the first duty detection signal and the second duty detection signal, which are stored.

8. The clock generating circuit of claim 1,
   further comprising a phase detecting circuit configured to compare phases of the input clock signal and a feedback clock signal, which is generated by delaying the output clock signal by an amount of modelled delay time, with each other to generate a phase detection signal, and
   wherein the delay control circuit is configured to change a value of the delay control signal based on the phase detection signal.

9. A clock generating circuit comprising:
a first delay line configured to delay, based on a delay control signal, an input clock signal to generate a first delay clock signal;
a second delay line configured to delay, based on the delay control signal, the input clock signal to generate a second delay clock signal having a phase difference corresponding to a unit amount of time from the first delay clock signal;
a third delay line configured to delay, based on the delay control signal, the input clock signal to generate a third delay clock signal;
a fourth delay line configured to delay, based on the delay control signal, the input clock signal to generate a fourth delay clock signal having a phase difference corresponding to the unit amount of time from the third delay clock signal;
a selected phase mixing circuit configured to generate, based on a first selection signal and a third selection signal, a first phase clock signal from at least one between the first delay clock signal and the third delay clock signal and configured to generate, based on a second selection signal and a fourth selection signal, a second phase clock signal from at least one between the second delay clock signal and the fourth delay clock signal; and
a delay control circuit configured to monitor respective duty cycles of the first to fourth delay clock signals to generate the first to fourth selection signals and configured to generate the delay control signal based on a result of the monitoring of the duty cycles.

10. The clock generating circuit of claim 9, wherein the delay control circuit is configured to change a value of the delay control signal for the monitoring of the duty cycles of the first to fourth delay clock signals.

11. The clock generating circuit of claim 10, wherein the delay control circuit is configured to:
enable the first selection signal according to whether the duty cycle of the first delay clock signal changes within a reference range,
enable the second selection signal according to whether the duty cycle of the second delay clock signal changes within the reference range,
enable the third selection signal according to whether the duty cycle of the third delay clock signal changes within the reference range, and
enable the fourth selection signal according to whether the duty cycle of the fourth delay clock signal changes within the reference range.

12. The clock generating circuit of claim 11, wherein the selected phase mixing circuit is configured to:
generate the first phase clock signal from the first delay clock signal when the first selection signal is enabled,
generate the first phase clock signal from the third delay clock signal when the third selection signal is enabled,
generate the first phase clock signal from the second delay clock signal when the second selection signal is enabled,
generate the second phase clock signal from the second delay clock signal when the second selection signal is enabled,
generate the second phase clock signal from the fourth delay clock signal when the fourth selection signal is enabled, and
generate the second phase clock signal from the second delay clock signal when the second selection signal is enabled.

13. The clock generating circuit of claim 11, wherein the selected phase mixing circuit is configured to:
generate the first phase clock signal by mixing phases of the first delay clock signal and the third delay clock signal when both the first selection signal and the third selection signal are enabled, and
generate the second phase clock signal by mixing phases of the second delay clock signal and the fourth delay clock signal when both the second selection signal and the fourth selection signal are enabled.

14. The clock generating circuit of claim 9, wherein the selected phase mixing circuit includes:
a first selected phase mixing circuit configured to generate, based on the first selection signal and the third selection signal, the first phase clock signal based on at least one between the first delay clock signal and the third delay clock signal; and
a second selected phase mixing circuit configured to generate, based on the second selection signal and the fourth selection signal, the second phase clock signal based on at least one between the second delay clock signal and the fourth delay clock signal.

15. The clock generating circuit of claim 14, wherein the first selected phase mixing circuit is configured to:
generate the first phase clock signal from the first delay clock signal when the first selection signal is enabled,
generate the first phase clock signal from the third delay clock signal when the third selection signal is enabled, and
generate the first phase clock signal by mixing phases of the first delay clock signal and the third delay clock signal when both the first selection signal and the third selection signal are enabled.

16. The clock generating circuit of claim 15, wherein the first selected phase mixing circuit includes:
a first driver configured to drive, based on the first selection signal, the first delay clock signal and configured to output the driven first delay clock signal to a common node;
a second driver configured to drive, based on the third selection signal, the third delay clock signal and configured to output the driven third delay clock signal to the common node; and
a third driver configured to drive a clock signal provided through the common node to generate the first phase clock signal.

17. The clock generating circuit of claim 14, wherein the second selected phase mixing circuit is configured to:
generate the second phase clock signal from the second delay clock signal when the second selection signal is enabled,
generate the second phase clock signal from the fourth delay clock signal when the fourth selection signal is enabled, and
generate the second phase clock signal by mixing phases of the second delay clock signal and the fourth delay clock signal when both the second selection signal and the fourth selection signal are enabled.

18. The clock generating circuit of claim 17, wherein the second selected phase mixing circuit includes:
a first driver configured to drive, based on the second selection signal, the second delay clock signal and configured to output the driven second delay clock signal to a common node;
a second driver configured to drive, based on the fourth selection signal, the fourth delay clock signal and configured to output the driven fourth delay clock signal to the common node; and a third driver configured to drive a clock signal provided through the common node to generate the second phase clock signal.

19. The clock generating circuit of claim 9, wherein the delay control circuit includes:

a duty cycle detector configured to detect the duty cycle of the first delay clock signal to generate a first duty detection signal, configured to detect the duty cycle of the second delay clock signal to generate a second duty detection signal, configured to detect the duty cycle of the third delay clock signal to generate a third duty detection signal and configured to detect the duty cycle of the fourth delay clock signal to generate a fourth duty detection signal;

a delay controller configured to gradually change a value of the delay control signal whenever any of the first to fourth duty detection signals is generated; and a selection controller configured to store values of the first to fourth duty detection signals and configured to enable the first to fourth selection signals based on the first to fourth duty detection signals, which are stored.

20. The clock generating circuit of claim 9, further comprising an output phase mixing circuit configured to mix, based on the delay control signal, phases of the first phase clock signal and the second phase clock signal to generate an output clock signal.

21. The clock generating circuit of claim 20, further comprising a phase detecting circuit configured to compare phases of the input clock signal and a feedback clock signal, which is generated by delaying the output clock signal by an amount of modelled delay time, with each other to generate a phase detection signal, and wherein the delay control circuit is configured to change a value of the delay control signal based on the phase detection signal.

* * * * *